(12) United States Patent
Luo

(10) Patent No.: US 12,598,973 B2
(45) Date of Patent: Apr. 7, 2026

(54) MICROELECTRONIC DEVICES, AND RELATED MEMORY DEVICES, ELECTRONIC SYSTEMS, AND METHODS

(71) Applicant: Micron Technology, Inc., Boise, ID (US)

(72) Inventor: Shuangqiang Luo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 696 days.

(21) Appl. No.: 17/805,221

(22) Filed: Jun. 2, 2022

(65) Prior Publication Data

US 2023/0395509 A1     Dec. 7, 2023

(51) Int. Cl.
| | |
|---|---|
| *H01L 23/535* | (2006.01) |
| *H01L 23/528* | (2006.01) |
| *H10B 41/27* | (2023.01) |
| *H10B 41/41* | (2023.01) |
| *H10B 43/27* | (2023.01) |
| *H10B 43/40* | (2023.01) |

(52) U.S. Cl.
CPC ........ *H01L 23/535* (2013.01); *H01L 23/5283* (2013.01); *H10B 41/27* (2023.02); *H10B 41/41* (2023.02); *H10B 43/27* (2023.02); *H10B 43/40* (2023.02)

(58) Field of Classification Search
CPC . H01L 23/5226; H01L 23/528; H01L 21/311; H01L 21/76877; H01L 21/76816; G11C 16/0483; H10B 41/27; H10B 43/50; H10B 43/27; H10B 41/10; H10B 43/35; H10B 41/50
See application file for complete search history.

(56) References Cited

U.S. PATENT DOCUMENTS

2023/0301101 A1* 9/2023 Lee ....................... H10B 43/50

* cited by examiner

*Primary Examiner* — Jessica S Manno
*Assistant Examiner* — Victor Joseph Lasasso
(74) *Attorney, Agent, or Firm* — TraskBritt

(57) ABSTRACT
A microelectronic device includes a stack structure comprising a vertically alternating sequence of conductive material and insulative material arranged in tiers, the stack structure divided into blocks by filled slot structures, each of the blocks comprising: a memory array region; staircase structures having steps; and crest regions interposed in a first horizontal direction between horizontally neighboring pairs of the staircase structures, and contact structures within the first crest region of each of the blocks and vertically extending through the stack structure to a source tier underlying the stack structure, the contact structures comprising: first contact structures in electrical communication with control logic circuitry; and second contact structures electrically isolated from the control logic circuitry, at least some the first contact structures relatively more centrally positioned with each of the blocks in a second horizontal direction orthogonal to the first horizontal direction than at least some of the second contact structures.

18 Claims, 10 Drawing Sheets

MICROELECTRONIC DEVICES, AND RELATED MEMORY DEVICES, ELECTRONIC SYSTEMS, AND METHODS

TECHNICAL FIELD

The disclosure, in various embodiments, relates generally to the field of integrated circuit device design and fabrication. More specifically, the disclosure relates to microelectronic devices including contact structures, and to related memory devices, electronic systems, and methods.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack structure including tiers of conductive structures and insulative materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the stack structure of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the stack structure of the memory device, and forming contact structures vertically extending contact structures through the stack structure, including through the staircase structures thereof. The contact structures also are formed within crest regions of the stack structure horizontally neighboring the staircase structures. Some of the contact structures may be configured and arranged relative to other feature to be electrically active within the memory device, and some other of the contact structures may be configured and arranged relative to other features to be electrically inactive within the memory device. The contact structures configured and arranged to be electrically inactive frequently serve as support structures during processing employed to form the memory device.

Unfortunately, conventional methods of forming a memory device, such as a NAND (logical "not and") Flash memory device, can result in undesirable signal results and physical damage to the memory devices.

DETAILED DESCRIPTION

Figure 1:
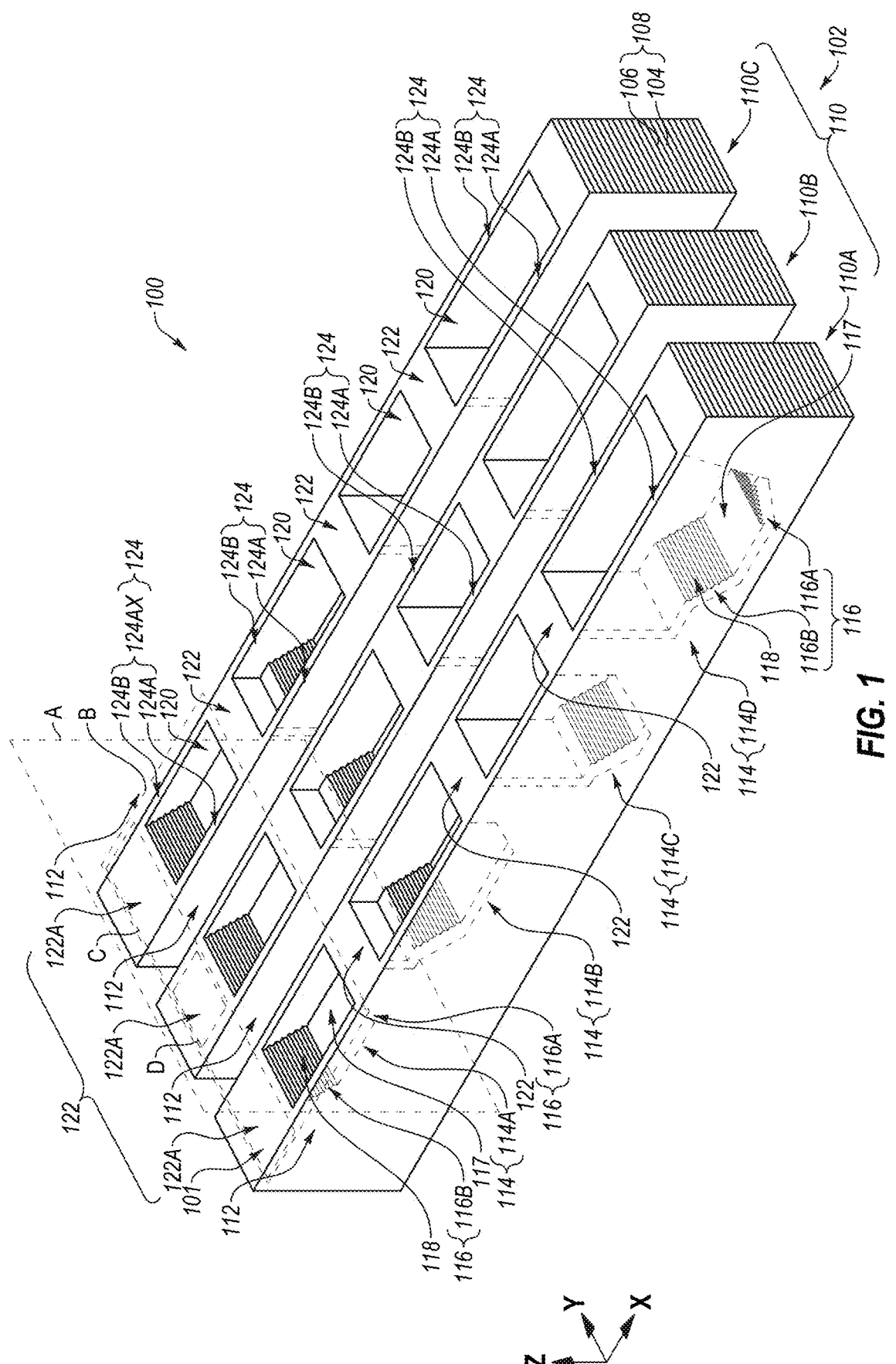
FIGS. 1, 2, and 3 are simplified, perspective (FIG. 1), longitudinal cross-section elevation (FIG. 2), and expanded top-down (FIG. 3) views of portions of a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, an integrated-circuit device, a dis-aggregated-die integrated circuit device). The structures described below do not form a complete microelectronic device. However, those process acts and structures useful to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, the term "integrated circuit" or "integrated-circuit device" may refer to a "microelectronic device" or a "nanoelectronic device," each of which may be tied to a critical dimension exhibited by inspection. The term "integrated circuit" includes without limitation a memory device, as well as other devices (e.g., semiconductor devices) which may or may not incorporate memory. The term "integrated circuit" may include without limitation a logic device. The term "integrated circuit" may include without limitation a processor device such as a central-processing unit (CPU) or a graphics-processing unit (GPU). The term "integrated circuit" may include without limitation or a radiofrequency (RF) device. Further, an "integrated-circuit" device may incorporate memory in addition to other functions such as, for example, a so-called "system on a chip" (SoC) including a processor and memory, or an integrated-circuit device including logic and memory. Further, an "integrated-circuit" device may incorporate memory in addition to other functions such as, for example, a so-called "disaggregated-die device" where distinct integrated-circuit components are associated to produce the higher function such as that of an SoC, including a processor alone, a memory alone, a processor and a memory, or an integrated-circuit device including logic and memory. A disaggregated-die device may be a system-in-package (SiP) assembly that includes at least two of at least one logic processor, at least one graphics processor, at least one memory device such as a 3-dimensional NAND memory device, at least one radiofrequency device, at least one analog device such as a capacitor, an inductor, a resistor, a balun, and these several at least one SiP devices, among others, may be assembled and connected with at least one embedded, multi-die interconnect bridge (EMIB) device, and at least two of the devices may be coupled with through-silicon via (TSV) technologies.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, features (e.g., regions, structures, devices) described as "neighboring" one another means and includes features of the disclosed identity (or identities) that are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride (SiN y)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

As used herein, the term "homogeneous" means relative amounts of elements included in a feature (e.g., a material, a structure) do not vary throughout different portions (e.g., different horizontal portions, different vertical portions) of the feature. Conversely, as used herein, the term "heterogeneous" means relative amounts of elements included in a feature (e.g., a material, a structure) vary throughout different portions of the feature. If a feature is heterogeneous, amounts of one or more elements included in the feature may vary stepwise (e.g., change abruptly), or may vary continuously (e.g., change progressively, such as linearly, parabolically) throughout different portions of the feature. The feature may, for example, be formed of and include a stack of at least two different materials.

Unless the context indicates otherwise, the materials described herein may be formed by any suitable technique including, but not limited to, spin coating, blanket coating, chemical vapor deposition (CVD), plasma enhanced CVD (PECVD), atomic layer deposition (ALD), plasma enhanced ALD (PEALD), physical vapor deposition (PVD) (e.g., sputtering), or epitaxial growth. Depending on the specific material to be formed, the technique for depositing or growing the material may be selected by a person of ordinary skill in the art. In addition, unless the context indicates otherwise, removal of materials described herein may be accomplished by any suitable technique including, but not limited to, etching (e.g., dry etching, wet etching, vapor etching), ion milling, abrasive planarization (e.g., chemical-mechanical planarization (CMP)), or other known methods.

Figure 2:
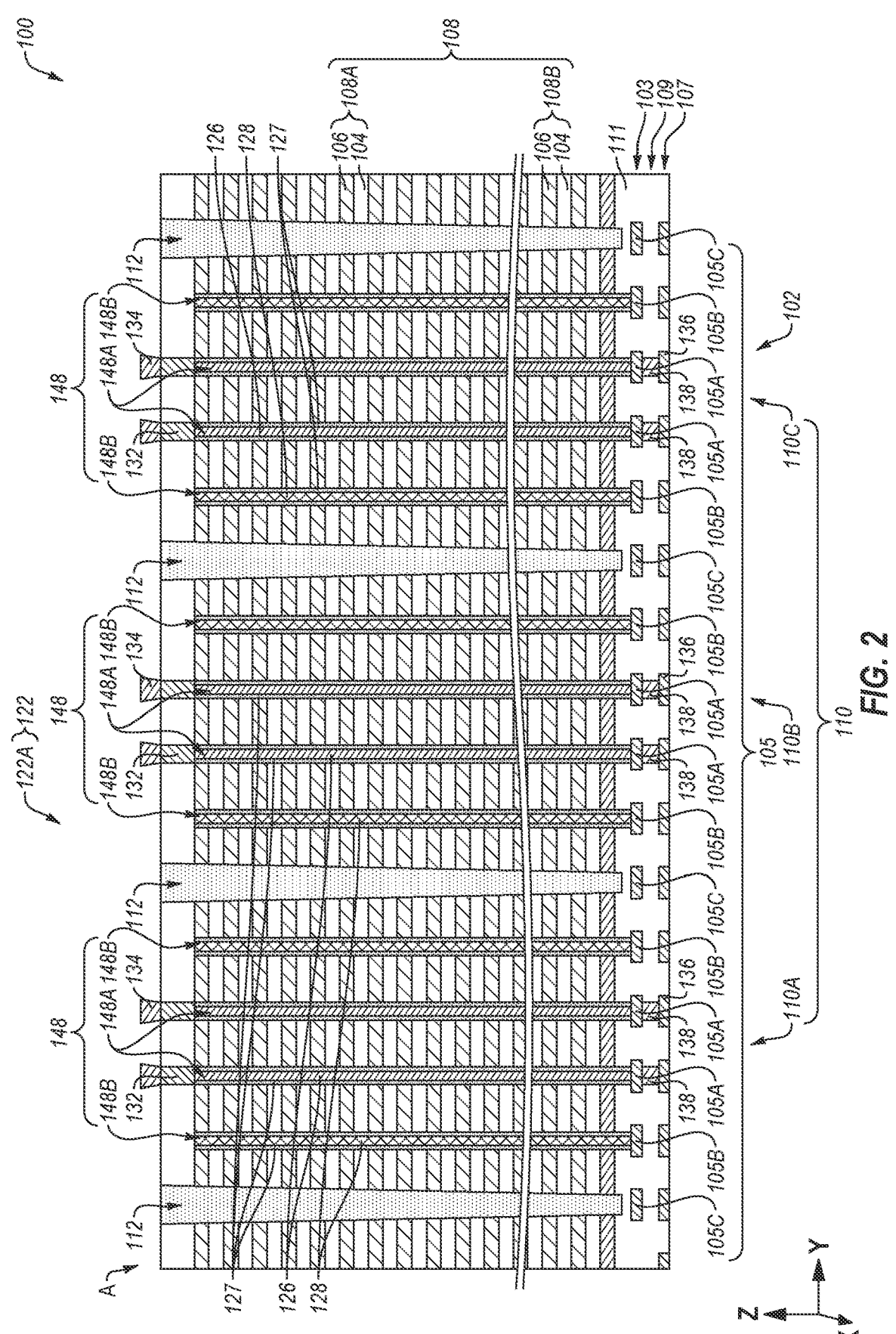
Figure 3:
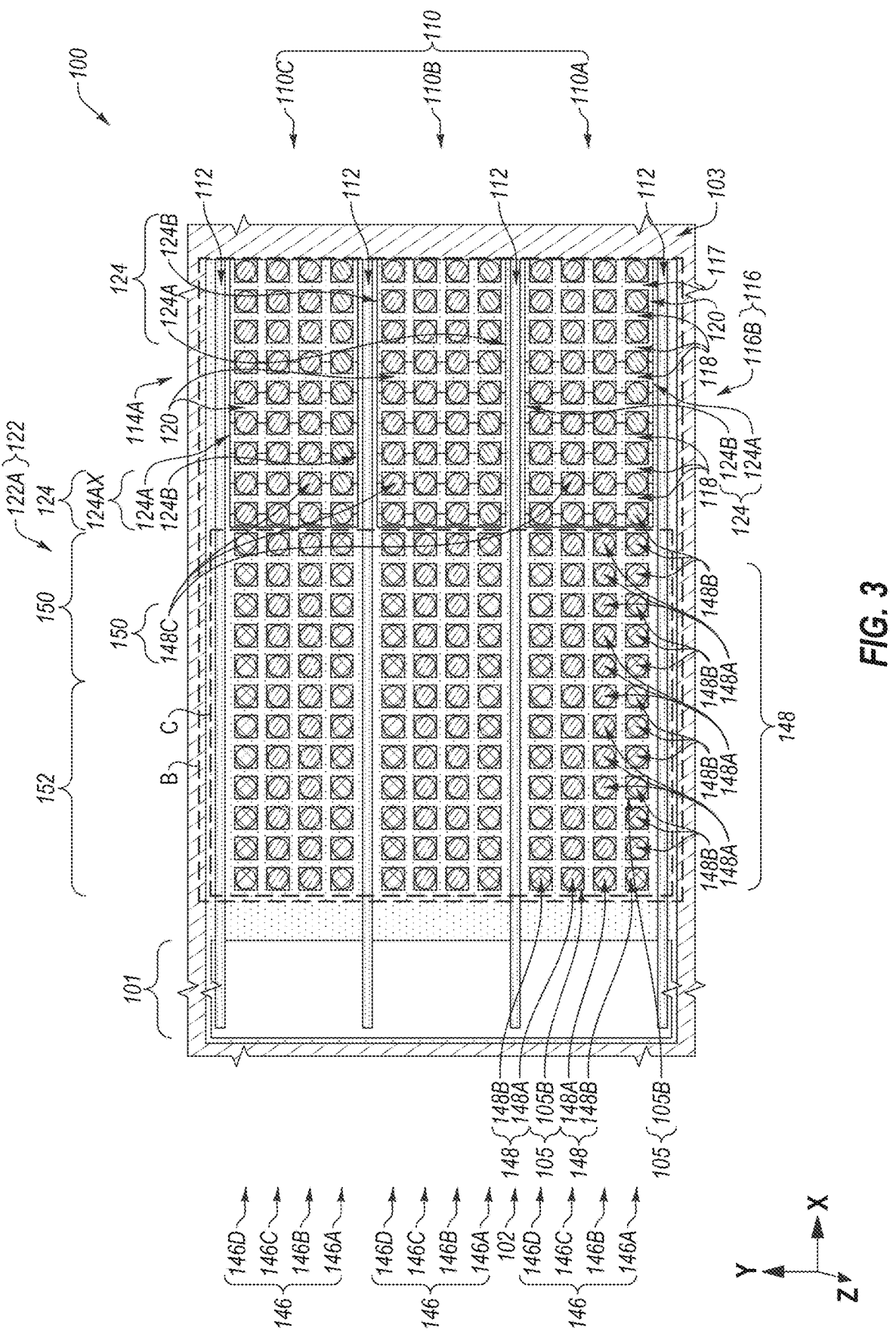

FIGS. 1, 2 and 3 are simplified views (each described in further detail below) of a microelectronic device structure 100, in accordance with several embodiments of this disclosure. FIG. 1 is a simplified, partial perspective view of the microelectronic device structure 100. FIG. 2 is a simplified, partial cross-section elevation view of the microelectronic device structure 100, taken from a section A in FIG. 1. FIG. 3 is a simplified partial top-down view of a portion of the microelectronic device structure 100 depicted in FIG. 1, taken from a section B in FIG. 1.

As shown in FIG. 1, the microelectronic device structure 100 may include a stack structure 102 including a vertically alternating (e.g., in a Z-direction) sequence of insulative material 104 and conductive material 106 arranged in tiers 108. Each of the tiers 108 of the stack structure 102 may individually include the conductive material 106 vertically neighboring (e.g., directly vertically adjacent) the insulative material 104. In addition, the stack structure 102 may be divided (e.g., segmented, partitioned) into blocks 110 (for illustrative clarity of disclosed embodiments: 110A, 110B and 110C) separated from one another by slot structures 112 (e.g., filled slots, filled slits, filled openings, filled trenches, dielectric-filled slot structures).

The slot structures 112 set apart the blocks 110, and the blocks 110 of the stack structure 102 may individually include stadium structures 114, crest regions 122 (e.g., elevated regions), and bridge regions 124 (e.g., additional elevated regions). The stadium structures 114 may be distributed throughout and substantially confined within horizontal areas of the blocks 110. A memory array region 101 of each block 110 if the stack structure 102 is located near an array-proximate crest region 122A of the block 110. In FIG. 1, for each block 110 of the stack structure 102, the memory array region 101 is located near the first stadium structure 114A, with the array-proximate crest region 122A horizontally interposed therebetween. Further with respect to the array-proximate crest region 122A is a forward-crest section 150 (FIG. 3) that is a section of the array-proximate crest region 122A that is relatively closest to an uppermost staircase 116, such as one of the staircases 116 of the first stadium structure 114A.

Within an individual block 110, one or more (e.g., each) of the stadium structures 114 may be formed at a vertical position after the formation of one or more (e.g., each) of the stadium structures 114 at a different vertical position. By way of non-limiting example, the first stadium structure 114A may be formed at a desired vertical position, along with additional stadium structures to be subsequently be vertically repositioned deeper with the block 110. Thereafter, the first stadium structure 114A, and a first chop process may be performed to form a second stadium structure 114B and other of the additional stadium structures at a deeper vertical position within the block 110 than the first stadium structure 114A. Next, the first stadium structure 114A and the second stadium structure 114B may be masked, and a second chop process may be performed to form a third stadium structure 114C and still other of the additional stadium structures at a deeper vertical position within the block 110 than the second stadium structure 114B. The first stadium structure 114A, the second stadium structure 114B, and the third stadium structure 114C may then be masked, and third chop process may be performed to form at least a four stadium structure 114D at a deeper vertical position within the block 110 than the third stadium structure 114C.

Each of the blocks 110 may include filled trenches 120 vertically overlying and within horizontal areas of the stadium structures 114 thereof. The crest regions 122 may be horizontally interposed between stadium structures 114 horizontally neighboring one another in the X-direction. The bridge regions 124 may horizontally neighbor opposing sides of individual stadium structures 114 in the Y-direction (hereinafter also referred to as the "first direction"), and may horizontally extend from and between crest regions 122 horizontally neighboring one another in the X-direction (hereinafter also referred to as the "second direction"). In FIG. 1, for clarity and ease of understanding the drawings and associated description, portions (e.g., some of the bridge regions 124 horizontally neighboring first sides of the stadium structures 114 in the Y-direction) of one of the blocks 110 of the stack structure 102 are depicted as transparent to more clearly show the stadium structures 114 distributed within the preliminary block 110.

The insulative material 104 of each of the tiers 108 of the stack structure 102 may be formed of and include at least one dielectric material, such one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., SiN g), at least one dielectric oxynitride material (e.g., $SiO_xN_y$), and at least one dielectric carboxynitride material (e.g., $SiO_xC_zN_y$). In some embodiments, the insulative material 104 of each of the tiers 108 of the stack structure 102 is formed of and includes a dielectric oxide material, such as $SiO_x$ (e.g., $SiO_2$). The insulative material 104 of each of the tiers 108 may be substantially homogeneous, or the insulative material 104 of one or more (e.g., each) of the tiers 108 may be heterogeneous.

The conductive material 106 of the tiers 108 of the stack structure 102 may include one or more of at least one conductively doped semiconductor material, at least one metal, at least one alloy, and at least one conductive metal-containing material (e.g., at last one conductive metal nitride, at least one conductive metal silicide, at least one conductive metal carbide, at least one conductive metal oxide). In some embodiments, the conductive material 106 includes tungsten (W). Optionally, at least one liner material (e.g., at least one insulative liner material, at least one conductive liner materials) may be located around the conductive material 106. The liner material may, for example, include one or more a metal (e.g., titanium, tantalum), an alloy, a metal nitride (e.g., tungsten nitride, titanium nitride, tantalum nitride), and a metal oxide (e.g., aluminum oxide). In some embodiments, the liner material comprises at least one conductive material employed as a seed material during the formation of the conductive material 106. In some embodiments, the liner material comprises titanium nitride ($TiN_x$, such as TiN). In further embodiments, the liner material further includes aluminum oxide ($AlO_x$, such as $Al_2O_3$). As a non-limiting example, for each of the tiers 108 of the stack structure 102, $AlO_x$, (e.g., $Al_2O_3$) may be directly adjacent the insulative material 104, $TiN_x$ (e.g., TiN) may be directly adjacent the $AlO_x$, and W may be directly adjacent the $TiN_x$.

Within each block 110 of the stack structure 102, the conductive material 106 of one or more relatively vertically higher tier(s) 108A (e.g., upper tiers, FIG. 2) may be employed for upper select gate structures (e.g., drain side select gate (SGD) structures) for upper select transistors (e.g., drain side select transistors) of the block 102, as described in further detail below. The conductive material 106 of relatively vertically higher tier(s) 108A (FIG. 2) may be segmented by one or more filled slot(s) (e.g., filled SGD slot(s)) for the upper select gate structures of the block 110, as also described in further detail below. In some embodiments, within each block 110 of the stack structure 102, the conductive material 106 of each of less than or equal to eight (8) relatively higher tier(s) 108A (e.g., from one (1) relatively vertically higher tier 108A to eight (8) relatively vertically higher tiers 108A) of the stack structure 102 is employed to for upper select gate structures (e.g., SGD structures) for the block 110. In addition, within each block 110 of the stack structure 102, the conductive material 134 of at least some relatively vertically lower tiers 108B (FIG. 2) vertically underlying the relatively vertically higher tier(s) 108A (FIG. 2) may be employed for access line structures (e.g., word line structures) of the block 133, as also described in further detail below. Moreover, within each block 110 of the stack structure 102, the conductive material 106 of at least a vertically lowest tier 108B (FIG. 2) may be employed for at least one lower select gate structure (e.g., at least one source side select gate (SGS) structure) for lower select transistors (e.g., source side select transistors) of the block 110, as also described in further detail below.

The stack structure 102 may include any desired number of the tiers 108. By way of non-limiting example, the stack structure 102 may include greater than or equal to sixteen (16) of the tiers 108, such as greater than or equal to thirty-two (32) of the tiers 108, greater than or equal to sixty-four (64) of the tiers 108, greater than or equal to one hundred and twenty-eight (128) of the tiers 108, or greater than or equal to two hundred and fifty-six (256) of the tiers 108.

Still referring to FIG. 1, the blocks 110 of the stack structure 102 may horizontally extend parallel in an X-direction. As used herein, the term "parallel" means substantially parallel. Horizontally neighboring blocks 110 of the stack structure 102 may be separated from one another in a Y-direction orthogonal to the X-direction by the slot structures 112. The slot structures 112 may also horizontally extend parallel in the X-direction. Each of the blocks 110 of the stack structure 102 may exhibit substantially the same geometric configuration (e.g., substantially the same dimensions and substantially the same shape) as each other of the blocks 110, or one or more of the blocks 110 may exhibit a different geometric configuration (e.g., one or more different dimensions and/or a different shape) than one or more other of the blocks 110. In addition, each pair of horizontally neighboring blocks 110 of the stack structure 102 may be horizontally separated from one another by substantially the same distance (e.g., corresponding to a width in the Y-direction of each of the slot structures 112) as each other pair of horizontally neighboring blocks 110 of the stack structure 102, or at least one pair of horizontally neighboring blocks 110 of the stack structure 102 may be horizontally separated from one another by a different distance than that separating at least one other pair of horizontally neighboring blocks 110 of the stack structure 102. In some embodiments, the blocks 110 of the stack structure 102 are substantially uniformly (e.g., substantially non-variably, substantially equally, substantially consistently) sized, shaped, and spaced relative to one another.

For example, an individual block 110 of the stack structure 102 may include greater than four (4) of the stadium structures 114 (e.g., greater than or equal to five (5) of the stadium structures 114, greater than or equal to ten (10) of the stadium structures 114, greater than or equal to twenty-five (25) of the stadium structures 114, greater than or equal to fifty (50) of stadium structures 114), or less than four (4) of the stadium structures 114 (e.g., less than or equal to three (3) of the stadium structures 114, less than or equal to two (2) of the stadium structures 114, only one (1) of the stadium structures 114). As another example, within an individual block 110, stadium structures 114 may be at least partially non-uniformly (e.g., non-equally, non-evenly) horizontally spaced, such that at least one of the stadium structures 114 is separated from at least two other of the stadium structures 114 horizontally neighboring (e.g., in the X-direction) the at least one stadium structures 114 by different (e.g., non-equal) distances. As an additional non-limiting example, within an individual block 110, vertical positions (e.g., in the Z-direction) of the stadium structures 114 may vary in a different manner (e.g., may alternate between relatively deeper and relatively shallower vertical positions) than that depicted in FIG. 1.

Each stadium structure 114 may include opposing staircase structures 116, and a central region 117 horizontally interposed between (e.g., in the X-direction) the opposing staircase structures 116. The opposing staircase structures 116 of each stadium structure 114 may include a forward staircase structure 116A and a reverse staircase structure 116B. A phantom line extending from a top of the forward staircase structure 116A to a bottom of the forward staircase structure 116A may have a positive slope, and another phantom line extending from a top of the reverse staircase structure 116B to a bottom of the reverse staircase structure 116B may have a negative slope. In additional embodiments, one or more of the stadium structure 114 may individually exhibit a different configuration than that depicted in FIG. 1. As a non-limiting example, at least one stadium structures 114 may be modified to include a forward staircase structure 116A but not a reverse staircase structure 116B (e.g., the reverse staircase structure 116B may be absent), or at least one stadium structure 114 may be modified to include a reverse staircase structure 116B but not a forward staircase structure 116A (e.g., the forward staircase structure 116A may be absent). In such embodiments, the central region 117 horizontally neighbors a bottom of the forward staircase structure 116A (e.g., if the reverse staircase structure 116B is absent), or horizontally neighbors a bottom of the reverse staircase structure 116B (e.g., if the forward staircase structure 116A is absent).

The opposing staircase structures 116 (e.g., the forward staircase structure 116A and the reverse staircase structure 116B) of an individual stadium structure 114 each include steps 118 defined by edges (e.g., horizontal ends) of the tiers 108 of the stack structure 102 within a horizontal area of an individual block 110 of the stack structure 102. For the opposing staircase structures 116 of an individual stadium structure 114, each step 118 of the forward staircase structure 116A may have a counterpart step 118 within the reverse staircase structure 116B having substantially the same geometric configuration (e.g., shape, dimensions), vertical position (e.g., in the Z-direction), and horizontal distance (e.g., in the X-direction) from a horizontal center (e.g., in the X-direction) of the central region 117 of the stadium structure 114. In additional embodiments, at least one step 118 of the forward staircase structure 116A does not have a counterpart step 118 within the reverse staircase structure 116B having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114; and/or at least one step 118 of the reverse staircase structure 116B does not have a counterpart step 118 within the forward staircase structure 116A having substantially the same geometric configuration (e.g., shape, dimensions), vertical position (e.g., in the Z-direction), and/or horizontal distance (e.g., in the X-direction) from horizontal center (e.g., in the X-direction) of the central region 117 of the stadium structure 114.

Each of the stadium structures 114 within an individual preliminary block 110 of the stack structure 102 may individually include a desired quantity of steps 118. Each of the stadium structures 114 may include substantially the same quantity of steps 118 as each other of the stadium structures 114, or at least one of the stadium structures 114 may include a different quantity of steps 118 than at least one other of the stadium structures 114. In some embodiments, at least one of the stadium structures 114 includes a different (e.g., greater, lower) quantity of steps 118 than at least one other of the stadium structures 114. As shown in FIG. 1, in some embodiments, the steps 118 of each of the stadium structures 114 are arranged in order, such that steps 118 directly horizontally adjacent (e.g., in the X-direction) one another correspond to tiers 108 of the stack structure 102 directly vertically adjacent (e.g., in the Z-direction) one another. In additional embodiments, the steps 118 of at least one of the stadium structures 114 are arranged out of order, such that at least some steps 118 of the stadium structure 114 directly horizontally adjacent (e.g., in the X-direction) one another correspond to tiers 108 of stack structure 102 not directly vertically adjacent (e.g., in the Z-direction) one another.

With continued reference to FIG. 1, for an individual stadium structure 114, the central region 117 thereof may horizontally intervene (e.g., in the X-direction) between and separate the forward staircase structure 116A thereof from the reverse staircase structure 116B thereof. The central region 117 may horizontally neighbor a vertically lowermost step 118 of the forward staircase structure 116A, and may also horizontally neighbor a vertically lowermost step 118 of the reverse staircase structure 116B. The central region 117 of an individual stadium structure 114 may have any desired horizontal dimensions. In addition, within an individual block 110 of the stack structure 102, the central region 117 of each of the stadium structures 114 may have substantially the same horizontal dimensions as the central region 117 of each other of the stadium structures 114, or the central region 117 of at least one of the stadium structures 114 may have different horizontal dimensions than the central region 117 of at least one other of the stadium structures 114.

For each block 110 of the stack structure 102, each stadium structure 114 (including the forward staircase structure 116A, the reverse staircase structure 116B, and the central region 117 thereof) within the block 110 may individually partially define boundaries (e.g., horizontal boundaries, vertical boundaries) of a filled trench 120 vertically extending (e.g., in the Z-direction) through the block 110. The crest regions 122 and the bridge regions 124 horizontally neighboring an individual stadium structure 114 may also partially define the boundaries of the filled trench 120 associated with the stadium structure 114. The filled trench 120 may only vertically extend through tiers 108 of the stack structure 102 defining the forward staircase structure 116A and the reverse staircase structure 116B of the stadium structure 114; or may also vertically extend through additional tiers 108 of the stack structure 102 not defining the forward staircase structure 116A and the reverse staircase structure 116B of the stadium structure 114, such as additional tiers 108 of the stack structure 102 vertically overlying the stadium structure 114. Edges of the additional tiers 108 of the stack structure 102 may, for example, define one or more additional stadium structures vertically overlying and horizontally offset from the stadium structure 114. Still referring to FIG. 1, for each block 110 of the stack structure 102, the crest regions 122 (which may also be referred to as "elevated regions" or "plateau regions") and the bridge regions 124 (which may also be referred to as "additional elevated regions" or "additional plateau regions") thereof may comprise portions of the block 110 remaining following the formation of the stadium structures 114. Within each block 110, crest regions 122 and the bridge region 124 thereof may define horizontal boundaries (e.g., in the X-direction and in the Y-direction) of unremoved portions of the tiers 108 of the stack structure 102. Further with respect to the disclosed embodiments, an array-proximate crest region 122A is a crest region 122 that is located between a memory array region 101 and the staircase 116 that is also at the elevation (Z-height) of the several crest regions 122. As illustrated, the array-proximate crest region 122A is located between the memory array region 101 and the staircase 116 of the first stadium structure 114A.

As shown in FIG. 1, the crest regions 122 of an individual block 110 of the stack structure 102 may intervene between and separate stadium structures 114 horizontally neighboring one another in the X-direction. For example, one of the crest regions 122 may intervene between and separate the first stadium structure 114A and the second stadium structure 114B; an additional one of the crest regions 122 may intervene between and separate the second stadium structure 114B and the third stadium structure 114C; and a further one of the crest regions 122 may intervene between and separate the third stadium structure 114C and the fourth stadium structure 114D. A vertical height of the crest regions 122 in the Z-direction may be substantially equal to a maximum vertical height of the block 110 in the Z-direction; and a horizontal width of the crest regions 122 in the Y-direction may be substantially equal to a maximum horizontal width of the block 110 in the Y-direction. In addition, each of the crest regions 122 may individually exhibit a desired horizontal length in the X-direction. Each of the crest regions 122 of an individual block 110 of the stack structure 102 may exhibit substantially the same horizontal length in the X-direction as each other of the crest regions 122 of the block 110; or at least one of the crest regions 122 of the block 110 may exhibit a different horizontal length in the X-direction than at least one other of the crest regions 122 of the block 110. Further, the array-proximate crest region 122A exhibits the same vertical height (Z-direction) as the other crest regions 122 and the array-proximate crest regions 122A are interposed between the memory array region 101 and the top staircase structure, particularly the reverse staircase structure 116B, of the first stadium structure 114A.

As shown in FIG. 1, the bridge regions 124 of an individual block 110 of the stack structure 102 may intervene between and separate the stadium structures 114 if the block 110 from the slot structures 112 horizontally neighboring the block 110 in the Y-direction. For example, for each stadium structure 114 within an individual block 110 of the stack structure 102, a first bridge region 124A may be horizontally interposed in the Y-direction between a first side of the stadium structure 114 and a first of the slot structures 112 horizontally neighboring the block 110; and a second bridge region 124B may be horizontally interposed in the Y-direction between a second side of the stadium structure 114 and a second of the slot structures 112 horizontally neighboring the block 110. The first bridge region 124A and the second bridge region 124B may horizontally extend in parallel in the X-direction. In addition, the first bridge region 124A and the second bridge region 124B and may each horizontally extend from and between crest regions 122 of the block 110 horizontally neighboring one another in the X-direction. The bridge regions 124 of the block 110 may be integral and continuous with the crest regions 122 of the block 110. Upper boundaries (e.g., upper surfaces) of the bridge regions 124 may be substantially coplanar with upper boundaries of the crest regions 122. A vertical height of the bridge regions 124 in the Z-direction may be substantially equal to a maximum vertical height of the block 110 in the Z-direction. In addition, each of the bridge regions 124 (including each first bridge region 124A and each second bridge region 124B) may individually exhibit a desired horizontal width in the Y-direction and a desired horizontal length in the X-direction. Each of the bridge regions 124 of the block 110 may exhibit substantially the same horizontal length in the X-direction as each other of the bridge regions 124 of the block 110; or at least one of the bridge regions 124 of the block 110 may exhibit a different horizontal length in the X-direction than at least one other of the bridge regions 124 of the block 110. In addition, each of the bridge regions 124 of the block 110 may exhibit substantially the same horizontal width in the Y-direction as each other of the bridge regions 124 of the block 110; or at least one of the bridge regions 124 of the block 110 may exhibit a different horizontal width in the Y-direction than at least one other of the bridge regions 124 of the block 110.

For each block 110 of the stack structure 102, the bridge regions 124 thereof horizontally extend around the filled trenches 120 of the block 110. As described in further detail below, some of the bridge regions 124 of the block 110 may be employed for continuous conductive paths extending from and between horizontally neighboring crest regions 122 of the block 110. As also described in further detail below, at least the bridge regions 124 (e.g., the first bridge region 124A and the second bridge region 124B) horizontally neighboring the first stadium structure 114A in the Y-direction may disrupt (e.g., break) at least a portion of the continuous conductive paths extending from and between the crest regions 122 horizontally neighboring the first stadium structure 114A in the X-direction. As disclosed for the array-proximate crest region 122A, a bridge-to-array-proximate, transition bridge region 124AX may couple this bridge region 124AX to at least the forward-crest section 150 (FIG. 3) of the array-proximate crest region 122A.

FIG. 2 is a simplified longitudinal cross-sectional elevation view of a portion of the microelectronic device structure 100 depicted in FIG. 1, taken from a section A at the array-proximate crest region 122A that is between the first stadium structure 114A and the memory array region 101, according to several embodiments.

Referring to FIG. 2, within horizontal areas at the array-proximate crest regions 122A of the blocks 110, contact structures 148 vertically extend through the stack structure 102 and to or partially into a source tier 103 underlying the stack structure 102. As shown in FIG. 2, the contact structures 148 include first contact structures 148A, also referred to as live contact structures 148A, and second contact structures 148B, also referred to as support contact structures 148B, or a second contact structures 148B. The first contact structures 148A may vertically extend to and land on (e.g., physically contact) connected conductive structures 105A within the source tier 103, and the second contact structures 148B may vertically extend to and land on "floating" (insulated, not electrically connected) conductive structures 105B within the source tier 103. The connected conductive structures 105A are also referred to herein as "first conductive structures 105A," and the floating conductive structures 105B are also referred to as "second conductive structures 105B." Additionally, slot-bottom conductive structures 105C are located below the slot structures 112, that are also not electrically connected to other structures below the source tier 103. The slot-bottom conductive structures 105C are also referred to as "third conductive structures 105C." Horizontal areas of the first contact structures 148A may horizontally overlap horizontal areas of the first conductive structures 105A, and each of the first contact structures 148A may physically contact a different first conductive structure 105A than each other of the first contact structures 148A. In addition, horizontal areas of the second contact structures 148B may horizontally overlap horizontal areas of the second conductive structures 105B, but multiple (e.g., more than one) of the second contact structures 148B may physically contact an individual (e.g., one) second conductive structure 105B. The second conductive structures 105B may individually horizontally extend (e.g., in the X-direction) from and between multiple second contact structures 148B, as described in further detail below.

The first contact structures 148A may be relatively more centrally positioned (e.g., in the Y-direction) within a horizontal area of an individual block 110 than the second contact structures 148B. Put another way, the second contact structures 148B may be positioned relatively more proximate (e.g., closer to) horizontal boundaries (e.g., a periphery) of the blocks 110 than the first contact structures 148A. In an embodiment, such as when four (4) contact structures 148 extend across an individual column of the contact structures 148 in the first direction (Y-direction), the first contact structures 148A are more centrally positioned in the Y-direction within a horizontal area of an individual block 110 than the second contact structures 148B. In addition, within an individual block 110, the second contact structures 148B may horizontally positioned more proximate the slot structures 112 than the first contact structures 148A.

Within each of the blocks 110 of the stack structure 102, the contact structures 148 may be arranged in rows extending in the X-direction, and columns extending in the Y-direction. In some embodiments, within an individual block 110, each of the columns of the contact structures 148 includes four (4) of the contact structures 148. For example, for an individual block 110, each of the columns of the contact structures 148 may include two (2) of the first contact structures 148A and two (2) of the second contact structures 148B. The two (2) of the first contact structures 148A may be positioned horizontally inward, in the Y-direction, of the two (2) of the second contact structures 148B. Put another way, for an individual block 110, an individual column of the contact structures 148 may include wo (2) of the second contact structures 148B horizontally flanking two (2) of the first contact structures 148A.

Each of the contact structures 148 (e.g., each of the first contact structures 148A, each of the second contact structures 148B) may be formed of and include multiple different materials 126, 127 and 128. The first contact structures 148A may individually include a conductive fill material 126, and a liner material 127 substantially covering and surrounding side surfaces (e.g., sidewalls) of the conductive fill material 126. The second contact structures 148B may individually include an insulative fill material 128, and the liner material 127 may also surround side surfaces (e.g., sidewalls) the insulative fill material 127. In additional embodiments, the second contact structures 148B may individually include the conductive fill material 126, and the liner material 127 surrounding side surfaces (e.g., sidewalls) the conductive fill material 126. In some embodiments, the conductive fill material 128 is formed of and includes a metallic material such as tungsten (W). In some embodiments, the liner material 127 is formed of and includes dielectric oxide material (e.g., SiO$_x$, such as SiO$_2$). The liner material 127 may electrically isolate the conductive fill material 126 from the conductive material 106 of the tiers 108 of the blocks 110 of the stack structure 102. In additional embodiments, such as some embodiments wherein the second contact structures 148B include the insulative material 128, the liner material 127 is omitted from one or more (e.g., each) of the second contact structures 148B.

The conductive fill material 126 of the first contact structures 148A may extend vertically from lower boundary of a conductive plug 132 to the source tier 103. At least some of the first contact structures 148A and the second contact structures 148B may be formed to extend to the source tier 103. For example, some of the first contact structures 148A and the second contact structures 148B may be configured to extend vertically (e.g., in the Z-direction) through the stack structure 102 and physically contact (e.g., land on) some of the structures within the source tier 103 to facilitate a predetermined function (e.g., an electrical interconnection function, a support function) of the first contact structures 148A and the second contact structures 148B. In other embodiments, some of the first contact structures 148A and the second contact structures 148B within the array-proximate crest region 122A do not provide electrical interconnection functionality, and serve primarily (e.g., only) to provide support at least during so-called "replacement gate" or "gate last" processing to form the conductive material 106 of the tiers 108 of the stack structure 102 of the microelectronic device structure 100.

Still referring to FIG. 2, the microelectronic device structure 100 further includes at least one conductive routing tier 107 (e.g., a metallization tier) underlying the source tier 103. The conductive routing tier 107 may include conductive routing structures 136. A conductive interconnect tier 109 may be located between the source tier 103 and the conductive routing tier 107. In an embodiment, the conductive interconnect tier 109 has conductive contacts 138 that couple the first contact structures 148A to the conductive routing tier 107. In an embodiment, both the first conductive structures 148A and the second conductive structures 148B, include the conductive fill material 126, but only the first conductive structures 148A are electrically coupled to a conductive routing layer 107, such as by the conductive contacts 138.

One or more dielectric materials 111 (e.g., one or more of at least one dielectric oxide material, at least one dielectric nitride material, at least one dielectric oxynitride material, at least one dielectric carboxynitride material, and amorphous carbon) may be horizontally interposed between conductive routing structures 136 of the conductive routing tier 107. The conductive routing tier 107 may be in electrical communication (e.g., by way of one or more conductive interconnect structures) with some of the features (e.g., some structures, such as some of the conductive structures) of the source tier 103, and may electrically connect the some of the features of the source tier 103 to other features of a microelectronic device (e.g., a memory device) including the microelectronic device structure 100, as described in further detail below. In turn, the conductive routing structures 136 of the conductive routing tier 107 may be electrically connected to additional structures and/or devices (e.g., back end of line (BEOL) devices; control logic devices, such as control logic devices including complementary metal-oxide-semiconductor (CMOS) circuitry) vertically underlying the source tier 103 of the microelectronic device structure 100.

The dielectric materials 111 may also vertically overlie and vertically underlie the first conductive structures 105A, the second conductive structures 105B and the third conductive structures 105C of the source tier 103, and may also horizontally intervene between and separate horizontally neighboring conductive structures 105 of the source tier 103. The dielectric materials 111 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., SiN g), at least one dielectric oxynitride material (e.g., $SiO_xN_y$), at least one dielectric carboxynitride material (e.g., $SiO_xC_zN_y$), and amorphous carbon. In some embodiments, the dielectric materials 111 are formed of and include $SiO_2$.

The conductive structures 105 of the source tier 103 may each individually be formed of and include conductive material, such as one or more of at least one metal (e.g., one or more of W, Ti, Mo, Nb, V, Hf, Ta, Cr, Zr, Fe, Ru, Os, Co, Rh, Jr, Ni, Pd, Pt, Cu, Ag, Au, and Al), at least one alloy (e.g., one or more of a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, and a stainless steel), at least one conductive metal-containing material (e.g., one or more of a conductive metal nitride, a conductive metal silicide, and a conductive metal carbide, a conductive metal oxide), and at least one conductively doped semiconductor material (e.g., one or more of conductively doped Si, conductively doped Ge, and conductively doped SiGe). In some embodiments, the conductive structures 105 of the source tier 103 are formed of and include conductively doped polycrystalline silicon. Each of the conductive structures 105 of the source tier 103 may be substantially homogeneous, or one or more the conductive structures 105 may individually be heterogeneous. In some embodiments, one or more (e.g., each) of the conductive structures 105 individually include a stack having polycrystalline silicon, and tungsten silicide ($WSi_x$) on or over the polycrystalline silicon. In some embodiments, the conductive structures 105 have substantially the same material composition and substantially the same material distribution as one another.

The first conductive structures 105A of the source tier 103 may each individually exhibit a desired geometric configuration (e.g., dimensions and shape) and horizontal spacing among and proximate the second conductive structures 105B. The geometric configurations and horizontal spacing of the first conductive structures 105A may be selected at least partially based on the configurations and positions of other features of the microelectronic device structure 100, such as the second conductive structures 105B. In some embodiments, one or more (e.g., each) of the first conductive structures 105A exhibits a generally quadrilateral (e.g., generally rectangular, generally square) horizontal cross-sectional shape. Within a horizontal area of an individual block 110 of the stack structure 102, each of the first conductive structures 105A may exhibit substantially the same geometric configuration (e.g., the same dimensions and the same shape) and horizontal spacing (e.g., in the X-direction, in the Y-direction) as each other of the first conductive structures 105A, or one or more of the first conductive structures 105A may exhibit a different geometric configuration (e.g., different dimension(s) and/or a different shape) and/or different horizontal spacing (e.g., in the X-direction, in the Y-direction) than one or more other of the first conductive structures 105A.

Figure 5A:
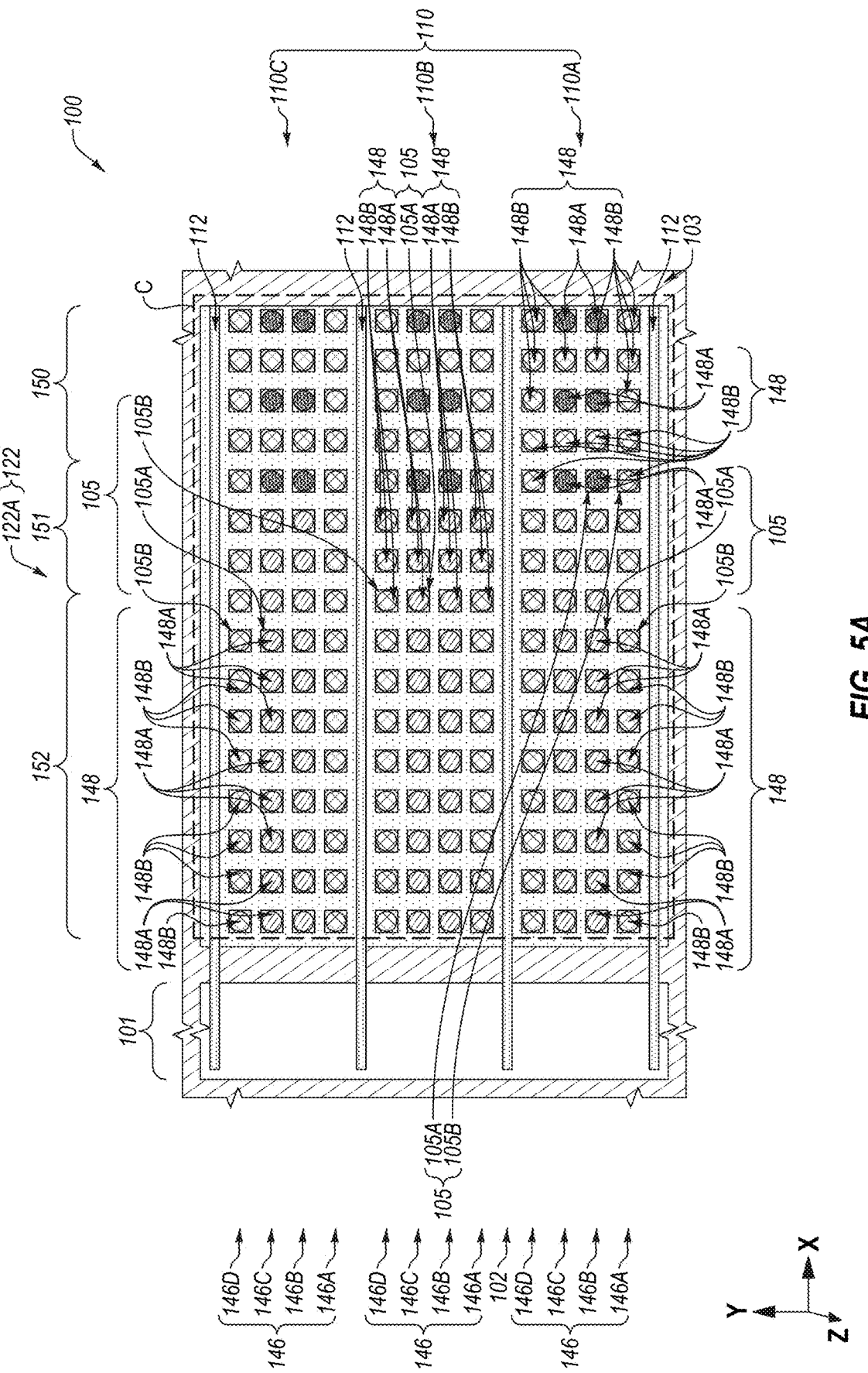
Figure 5B:
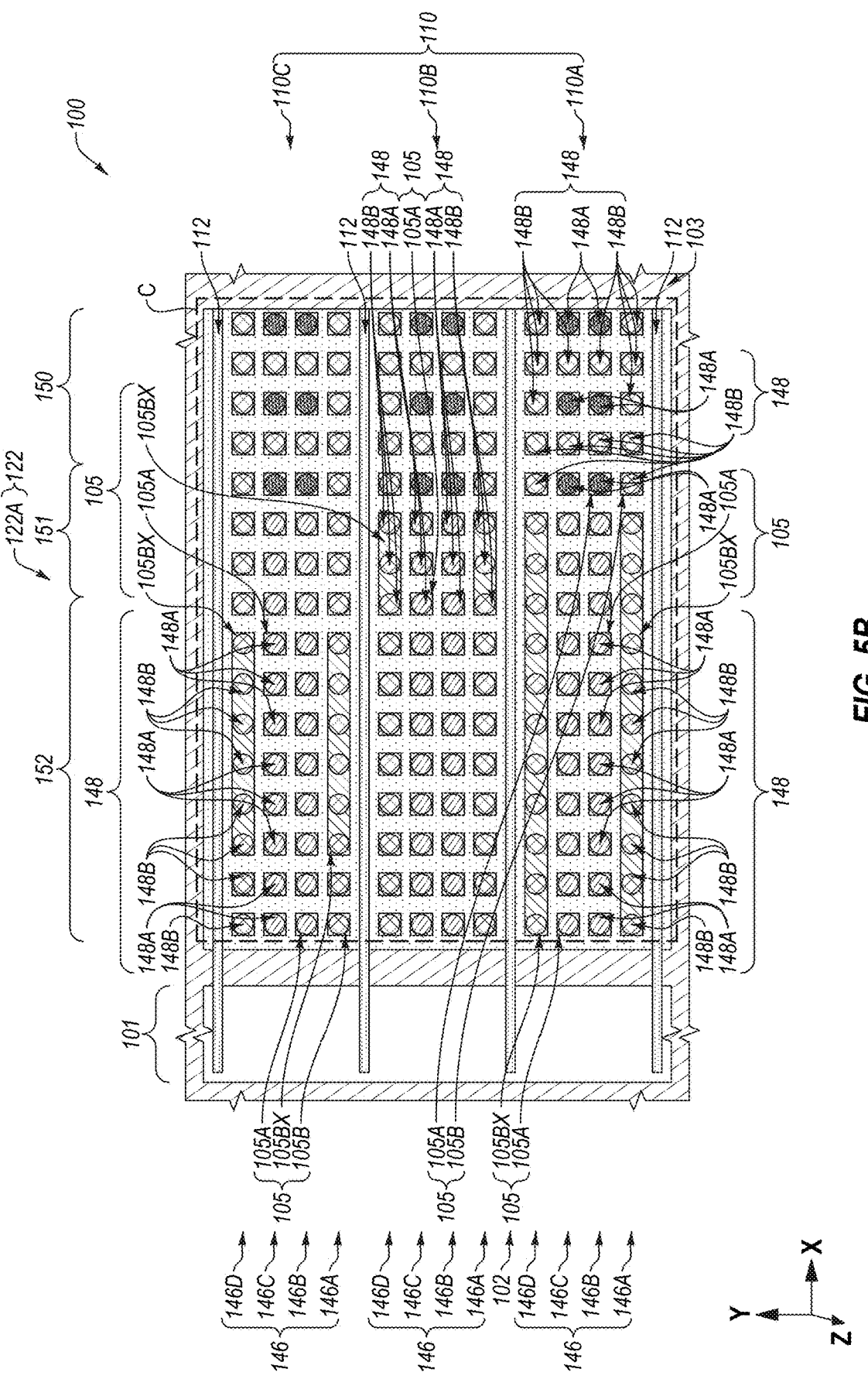

The second conductive structures 105B of the source tier 103 may individually exhibit a relatively larger horizontal area in the X-direction than individual first conductive structures 105A of the source tier 103 (see, e.g., FIG. 5B).

FIG. 3 is a simplified, partial top-down view that includes a section B of the microelectronic device structure 100 shown in FIG. 1. Adjacent the section B is a simplified partial, top down view of the memory array region 101. The section B includes portions of three (3) of the blocks 110 of the stack structure 102, as well a portion of two (2) of the slot structures 112 horizontally interposed between the three (3) of the blocks 110. The blocks 110 may be referred to as a first block 110A, a second block 110B and a third block 110C for illustrative clarity, but the three blocks 110A, 110B and 110C may be substantially the same as one another. The section B intersects with a portion of the array-proximate crest region 122A that is adjacent the memory array region 101, and the section B intersects with a portion of the first stadium structures 114A within three (3) of the blocks 110, as well as additional regions of the three (3) of the blocks 110 and the intervening slot structures 112. Additionally, a section C (also indicated in FIG. 1) includes at least part of an array-proximate crest region 122A (FIG. 1) that is approximately between the first stadium structure 114A (FIG. 1) and the memory array region 101. Additionally, with a stadium-proximate section 150 across the array-proximate crest region 122A, the stadium-proximate section 150 is adjacent the first stadium structure 114A (FIGS. 1 and 3). The stadium-proximate section 150 may be referred to as a forward-crest section 150, as it may be at or near a boundary of the array-proximate crest region 122A and a first stadium section 114A. An array-proximate section 152 of the array-proximate crest region 122A may be adjacent the memory array region 101. The stadium-proximate section 150 may be referred to as a first section 150 of the array-proximate crest region 122A, and the array-proximate section 152 may be referred to as a second section 152A of the array-proximate crest region 122A. In an embodiment, the stadium-proximate section 150 only has centrally located first contact structures 148A in the blocks 110, including and limited to a second row 146B and a third row 146C, and within the stadium proximate section 150 only second contacts structures 148B are peripherally located in the blocks 110, including to a first row 146A and a fourth row 146D. Within the stadium proximate section 150, second contact structures 148B may also be located within the second row 146B and the third row 146C (see, e.g., FIGS. 4, 5A and 5B), as buffer contact structures among first contact structures 148A that are confined to the second row 146B and to the third row 146C.

Referring to FIG. 3, a portion of the first stadium structure 114A of each of the blocks 110 includes a portion of a reverse staircase 116B including steps 118. The bridge regions 124 including first bridge regions 124A and second bridge regions 124B of the transition bridge region 124AX that bound the steps 118 of the reverse staircase 116B of the first stadium structure 114A. The filled trenches 120 (FIG. 1) are indicated by approximate location but the filled trenches 120 are not illustrated for clarity, to illustrate first contact structures 148A within the first stadium structure 114A. The contact structures 148 within the first stadium structure 114A and within the crest regions 122, may be referred to in sequential columns 146 including a first row 146A, a second row 146B, a third row 146C and a fourth row 146D. Again referring to the first stadium structure 114A, in an embodiment, all the contact structures 148 are referred to as stadium contact structures 148C, that may include conductive contact material 126 (FIG. 2) and optionally may include insulative liner material 127 (FIG. 2). Additionally, the contact structures 148 within the first stadium structure 114A, may include second contact structures 148B (FIG. 2).

Again referring to FIG. 3, the array-proximate crest region 122A is indicated in part within the section C taken from FIG. 1. The array-proximate crest region 122A may include first contact structures 148A in the second rows 146B and the third rows 146C, and second contact structures 148B in the first rows 146A and the fourth rows 146D. As illustrated within the first block 110A, the source tier structures 105, including first conductive structures 105A (one occurrence indicated) and second conductive structures 105B (one occurrence indicated) of the source tier 103, are positioned below (Z-direction) the first contact structures 148A and the second contact structures 148B, respectively. Additionally, for a stadium-proximate section 150 across the array-proximate crest region 122A, the stadium-proximate section 150 is adjacent the first stadium structure 114A (FIGS. 1 and 3). The stadium-proximate section 150 may be referred to as a forward-crest section 150 as it may be at or near a boundary of the array-proximate crest region 122A. As illustrated at the transition from the first stadium structure 114A and the forward-crest section 150, the first contact structures 148A may be limited to the second row 146B and the third row 146C, and second contact structures 148B may neighbor the live contact structures 148A. The second contact structures 148B may be limited to the first row 146A and the fourth row 146D.

Figure 4:
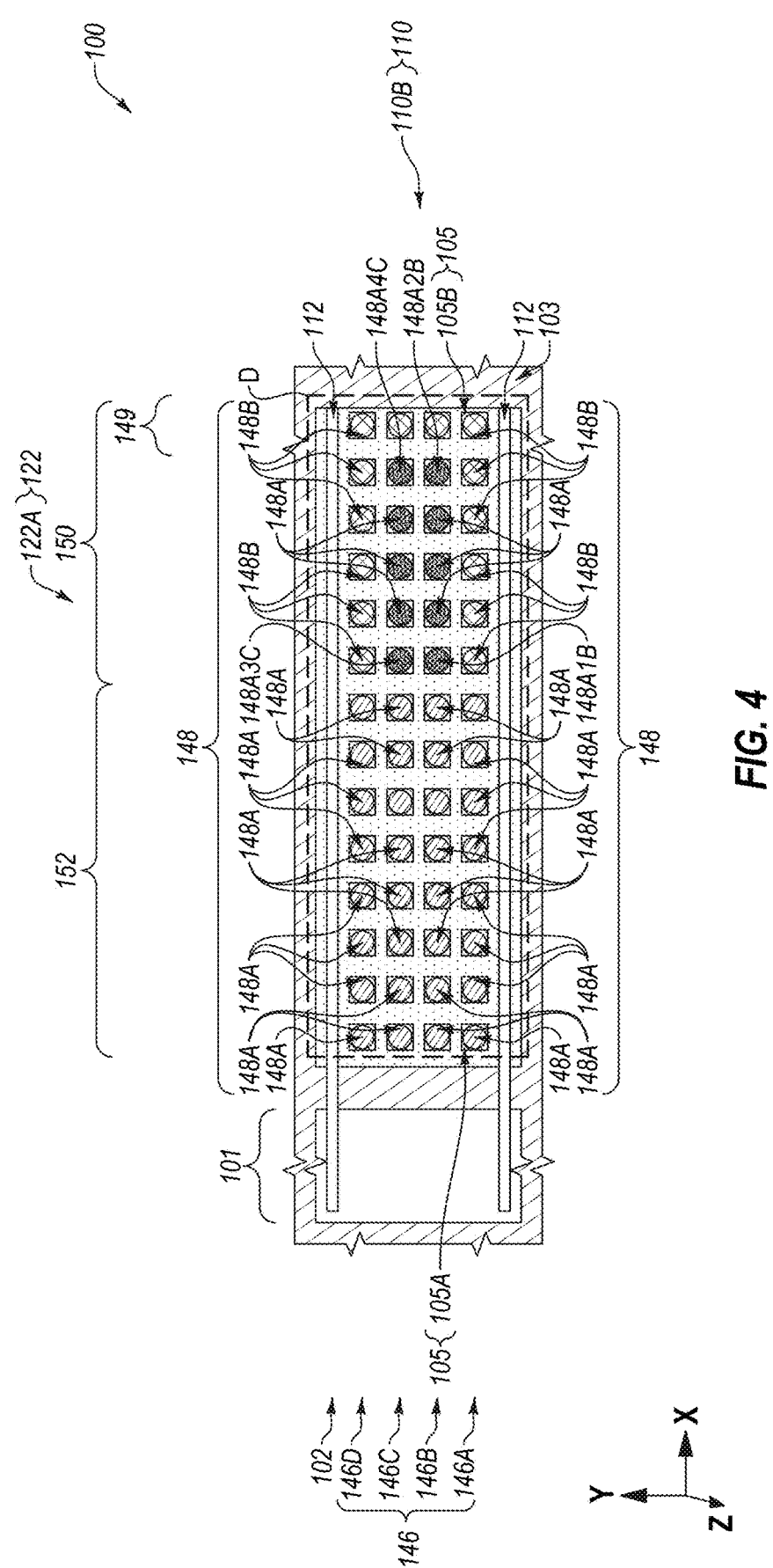
FIGS. 4, 5A, 5B, 6 and 7 are simplified, top down views of different portions the microelectronic device structure shown in FIGS. 1, 2 and 3, according to several embodiments of the disclosure.

FIG. 4 is a simplified, partial top-down view that includes a section D of a portion of the microelectronic device structure 100 depicted in FIG. 1. The section D includes portions of the array-proximate crest region 122A of one of the blocks 110 of the stack structure 102, as well portions of two (2) of the slot structures 112 horizontally interposed between three (3) of the blocks 110 (FIG. 1). The section D is taken from part of the second block 110B in FIG. 1. Further referring to FIG. 4, attention is directed to the second block 110B (FIG. 1), but this is by non-limiting illustrated example. For an individual block 110, the section D is horizontally interposed between (e.g., in the X-direction) the memory array region 101 of the block 110 and the first stadium structure 114A (FIGS. 1 and 3) of the block 110.

As shown in FIG. 4, an array-proximate section 152 including multiple columns of first contact structures 148A extending in parallel in the Y-direction may be located between a stadium-proximate section 150 and the memory array region 101. The stadium-proximate section 150 may also be referred to as a first section 150 and the array-proximate section 152 may be referred to as a second section 152. The array-proximate section 152 may only include first contact structures 148A in each column of the first contact structures 148A (e.g., each column may be free of any second contact structures 148B).

In the stadium-proximate section 150 of the array-proximate crest region 122A, first contact structures 148A may be grouped together in each the second row 146B and the third row 146C. In an embodiment, the first contact structures 148A within the stadium-proximate section 150 of the array-proximate crest region 122A, are the only so-called "live" contact structures within the stadium-proximate section 150 configured to relay signals through the stadium-proximate section 150 of the block 110. Within the stadium-proximate section 150 of an individual block 110, first contact structures 148A may be absent from the first row 146A and the fourth row 146D of the contact structures 148. Instead, within the stadium-proximate section 150 of the block 110, only second contact structures 148B may be located within the first row 146A and the fourth row 146D of the contact structures 148. Within the stadium-proximate section 150 of the block 110, the first contact structures 148A may only be located the second row 146B and the third row 146C of the contact structures 148. Further, at least one column of second contact structures 148B may be provided within a buffer column section 149 positioned between the stadium-proximate section 150 of the array-proximate crest region 122A and the first stadium structure 114A (FIGS. 1 and 3).

In additional embodiments, the microelectronic device structure 100 has a different arrangement of the first contact structures 148A and the second contact structures 148B than that described above with reference to FIGS. 3 and 4. For example, FIG. 5A is a simplified, partial top-down view that includes a section C of a portion of the microelectronic device structure 100 depicted in FIG. 1, in accordance with additional embodiments of the disclosure. The section C includes portions of the array-proximate crest regions 122A of three (3) of the blocks 110 of the stack structure 102, as well as portions of two (2) of the slot structures 112 that are horizontally interposed between the three (3) of the blocks 110. For an individual block 110, the section D is horizontally interposed (e.g., in the X-direction) between the memory array region 101 of the block 110 and the first stadium structure 114A (FIGS. 1 and 3) of the block 110.

As shown in FIG. 5A, in the stadium-proximate section 150, first contact structures 148A remain grouped within the second row 146B and the third row 146C of the contact structures 148. Further, within the stadium-proximate section 150 of the array-proximate crest region 122A, first contact structure 148A in different columns of the contact structures 148 than one another are separated from one another by second contact structures 148B within additional columns of the contact structures 148 horizontally interposed between the different columns of the contact structures 148. Put another way, first contact structures 148A neighboring one another within positions of an individual row of the contact structures 148 within the stadium-proximate section 150 have one of the second contact structures 148B horizontally interposed therebetween. Each first contact structure 148A within the stadium-proximate section 150 of the array-proximate crest region 122A may neighbor, in the Y-direction, at least one row of the contact structures 148 that includes some of the second contact structures 148B. Within the stadium-proximate section 150 of an individual block (e.g., the first block 110A), the first contact structures 148A may be positioned on the first conductive structures 105A, and the second contact structures 148B may be positioned on the second conductive structures 105B. In an embodiment, the first contact structures 148A within the stadium-proximate section 150 of the array-proximate crest region 122A are the only so-called "live" contact structures within the stadium-proximate section 150 configured to relay signals through the stadium-proximate section 150 of the block 110.

Still referring to FIG. 5A, the array-proximate crest region 122A may include a spacer section 151 horizontally interposed between the stadium-proximate section 150 and the memory-array-proximate first contact section 152. Within an individual block 110, the spacer section 151 may include multiple columns of the contact structures 148 that individually include first contact structures 148A and second contact structures 148B. As shown in FIG. 5A, portions of the first row 146A and the fourth row 146D of the contact structures 148 within the spacer section 151 may only include first contact structures 148A, and portions of the second row 146B and the third row 146C of the contact structures 148 within spacer section 151 may only include second contact structures 148A. Within the spacer section 151 of an individual block 110, the first contact structures 148A may be positioned on the first conductive structures 105A, and the second contact structures 148B may be positioned on the second conductive structures 105B. In an embodiment, the first contact structures 148A within the spacer section 151 of the array-proximate crest region 122A are the only so-called "live" contact structures within the spacer section 151 configured to relay signals through the spacer section 151 of the block 110.

With continued reference to FIG. 5A, within an individual block 110 of the stack structure 102, the memory-array-proximate first contact section 152 of the array-proximate crest region 122A may also include multiple columns of the contact structures 148 that individually include first contact structures 148A and second contact structures 148B. As shown in FIG. 5A, portions of the first row 146A and the fourth row 146D of the contact structures 148 within the memory-array-proximate first contact section 152 may only include first contact structures 148A, and portions of the second row 146B and the third row 146C of the contact structures 148 within the memory-array-proximate first contact section 152 may only include second contact structures 148A. Within the memory-array-proximate first contact section 152 of an individual block 110, the first contact structures 148A may be positioned on the first conductive structures 105A, and the second contact structures 148B may be positioned on the second conductive structures 105B. In an embodiment, the first contact structures 148A within the memory-array-proximate first contact section 152 of the array-proximate crest region 122A are the only so-called "live" contact structures within the memory-array-proximate first contact section 152 configured to relay signals through the memory-array-proximate first contact section 152 of the block 110.

In further embodiments, the microelectronic device structure 100 has a different arrangement of the first contact structures 148A and the second contact structures 148B than those described above with reference to FIGS. 3, 4, and 5A. For example, FIG. 5B is a simplified, partial top-down view that includes a section C of a portion of a microelectronic device structure 200 such as the microelectronic device structure 100 depicted in FIG. 1. The enumerated features (e.g., structures, regions) illustrated in FIG. 5B, may be analogous or the same as those enumerated features illustrated in FIG. 5A. In contrast to the embodiments of the microelectronic device structure 100 depicted in FIGS. 3, 4, 5A, for the microelectronic device structure 200 depicted in FIG. 5B, some of the second conductive structures 105B within a horizontal area of an individual block 110 of the stack structure 102 may individually horizontally extend under multiple (e.g., more than one) of the second contact structures 148B.

In the description that follows with reference to FIG. 5B, unique configurations of the second conductive structures 105B are described with reference to the first block 110A, the second block 110B, and the third block 110C of the stack structure 102, wherein the configurations of the second conductive structures 105B within horizontal areas of the first block 110A, the second block 110B, and the third block 110C are different than one another. However, it will be understood that the configuration of the second conductive structures 105B described in relation any one of the blocks 110 (e.g., any one of the first block 110A, the second block 110B, and the third block 110C) may be employed for any others of the blocks 110 (e.g., any others of the first block 110A, the second block 110B, and the third block 110C). A configuration of the second conductive structures 105B may be substantially the same for each of the blocks 110 of the stack structure 102, or a configuration of second conductive structures 105B operatively associated with one of the blocks 110 may be different than a configuration of the second conductive structures 105B operatively associated with another one of the blocks 110.

Attention is first directed to the first block 110A of the stack structure 102 of the microelectronic device structure 200. For the first block 110A, extended second conductive structures 105BX, a sub-group of the second conductive structures 105B, may be positioned within horizontal areas of the spacer section 151 and the memory-array-proximate first contact section 152 of the array-proximate crest region 122A. The extended second conductive structures 105BX may individually horizontally extend substantially continuously in the X-direction across the spacer section 151 and the memory-array-proximate first contact section 152, and may individually horizontally overlap one of rows 146 of the contact structures 148 in the Y-direction. Each extended second conductive structure 105BX may be operatively associated with some of the second contact structures 148B within the spacer section 151 and the memory-array-proximate first contact section 152. For example, at least some of the second contact structures 148B within portions of the first row 148A and the fourth row 148D of the contact structures 148 located within the spacer section 151 and the memory-array-proximate first contact section 152 may land on (and be supported by) the extended second conductive structures 105BX. One of the extended second conductive structures 105BX may be horizontally aligned in the Y-direction with the first row 148A, and the other of the second conductive structures 105BX may be horizontally aligned in the Y-direction with the fourth row 148D. The extended second conductive structures 105BX may not have any of the first contact structures 105A in contact (e.g., physical contact, electrical contact) therewith. The first contact structures 105A may be positioned within the second row 148B and the third row 148C of the contact structures 148 horizontally interposed in the Y-direction between the extended second conductive structures 105BX, and may contact (e.g., physical contact, electrical contact) the first conductive structures 105A. The extended second conductive structures 105BX may not extend into the stadium-proximate section 150. Rather, only the second conductive structures 105B may be operatively associated with the second contact structures 148B within the stadium-proximate section 150 of the array-proximate crest region 122A.

Attention is next directed to the second block 110B of the stack structure 102 of the microelectronic device structure 200. For the second block 110A, extended second conductive structures 105BX may only be positioned within a horizontal area of the spacer section 151 of the array-proximate crest region 122A. The extended second conductive structures 105BX may individually horizontally extend substantially continuously in the X-direction across the spacer section 151, and may individually horizontally overlap one of rows 146 of the contact structures 148 in the Y-direction. Each extended second conductive structure 105BX may be operatively associated with some of the second contact structures 148B within the spacer section 151. For example, at least some of the second contact structures 148B within portions of the first row 148A and the fourth row 148D of the contact structures 148 located within the spacer section 151 may land on (and be supported by) the extended second conductive structures 105BX. One of the extended second conductive structures 105BX may be horizontally aligned in the Y-direction with the first row 148A, and the other of the second conductive structures 105BX may be horizontally aligned in the Y-direction with the fourth row 148D. The extended second conductive structures 105BX may not have any of the first contact structures 105A in contact (e.g., physical contact, electrical contact) therewith. The first contact structures 105A may be positioned within the second row 148B and the third row 148C of the contact structures 148 horizontally interposed in the Y-direction between the extended second conductive structures 105BX, and may contact (e.g., physical contact, electrical contact) the first conductive structures 105A. The extended second conductive structures 105BX may not extend into the stadium-proximate section 150 or the memory-array-proximate first contact section 152. Rather, only the second conductive structures 105B may be operatively associated with the second contact structures 148B within the stadium-proximate section 150 and the memory-array-proximate first contact section 152 of the array-proximate crest region 122A.

Attention is next directed to the third block 110B of the stack structure 102 of the microelectronic device structure 200. For the third block 110A, extended second conductive structures 105BX may only be positioned within a horizontal area of the memory-array-proximate first contact section 152 of the array-proximate crest region 122A. The extended second conductive structures 105BX may individually horizontally extend substantially continuously in the X-direction across the memory-array-proximate first contact section 152, and may individually horizontally overlap one of rows 146 of the contact structures 148 in the Y-direction. Each extended second conductive structure 105BX may be operatively associated with some of the second contact structures 148B within the memory-array-proximate first contact section 152. For example, at least some of the second contact structures 148B within portions of the first row 148A and the fourth row 148D of the contact structures 148 located within the memory-array-proximate first contact section 152 may land on (and be supported by) the extended second conductive structures 105BX. One of the extended second conductive structures 105BX may be horizontally aligned in the Y-direction with the first row 148A, and the other of the second conductive structures 105BX may be horizontally aligned in the Y-direction with the fourth row 148D. The extended second conductive structures 105BX may not have any of the first contact structures 105A in contact (e.g., physical contact, electrical contact) therewith. The first contact structures 105A may be positioned within the second row 148B and the third row 148C of the contact structures 148 horizontally interposed in the Y-direction between the extended second conductive structures 105BX, and may contact (e.g., physical contact, electrical contact) the first conductive structures 105A. The extended second conductive structures 105BX may not extend into the stadium-proximate section 150 or the spacer section 151. Rather, only the second conductive structures 105B may be operatively associated with the second contact structures 148B within the stadium-proximate section 150 and the spacer section 151 of the array-proximate crest region 122A.

Figure 6:
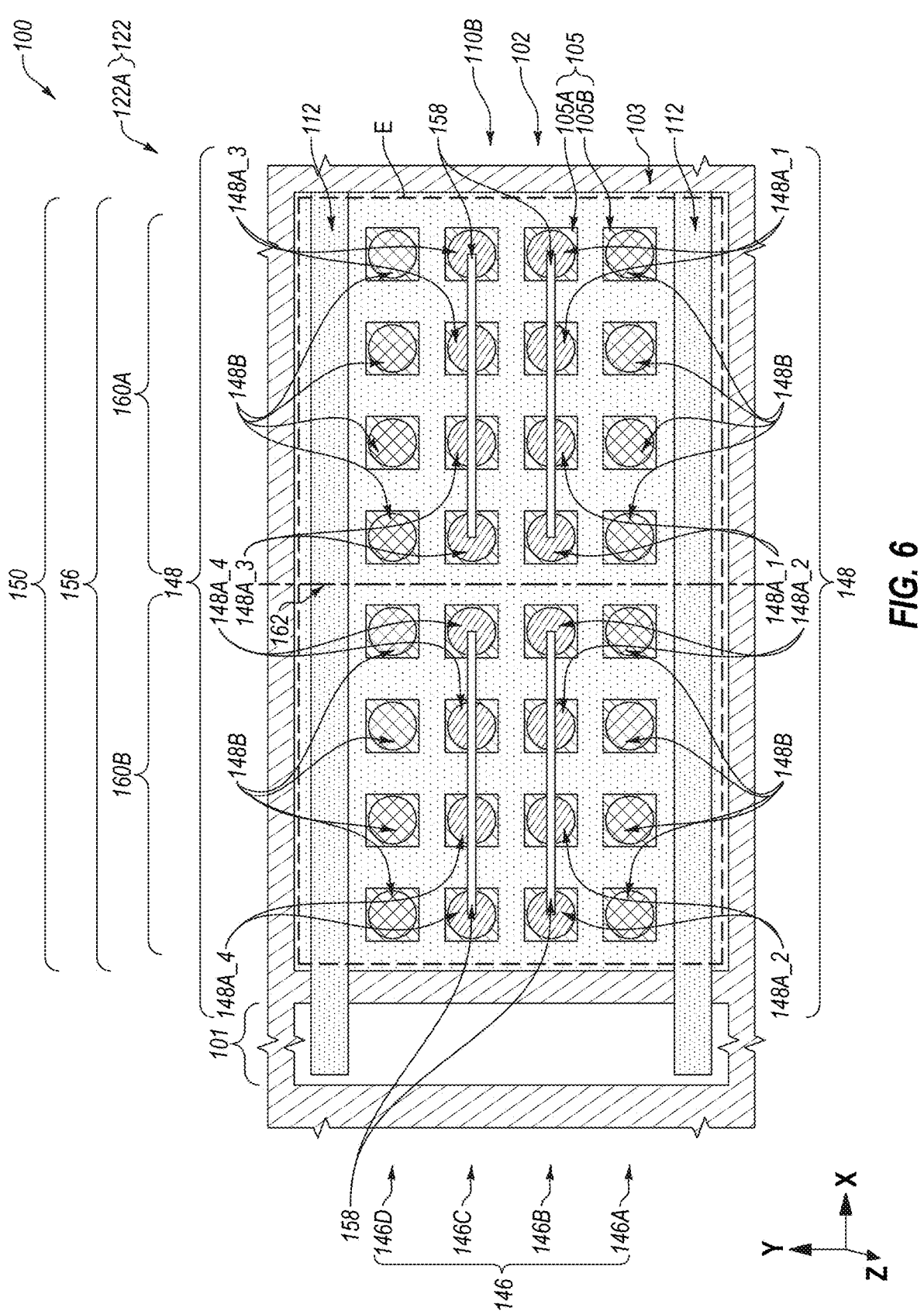

FIG. 6 is a simplified, partial top-down view that includes a section E of a portion of the microelectronic device structure 100 depicted in FIG. 1, in accordance with embodiments of the disclosure. The section E includes portions of the array-proximate crest region 122A of an individual block 110 of the stack structure 102, as well as portions of two (2) of the slot structures 112 that horizontally neighbor the block 110. FIG. 6 shows an embodiment of a conductive routing configuration that may be employed in combination with the arrangement of the first contact structures 148A and the second contact structures 148B within the stadium-proximate section 150 of the array-proximate crest region 122A of the block 110. As depicted in FIG. 6, groups of first contact structures 148A may be ganged together within an interconnection region 156. Some of the groups of first contact structures 148A may be located within a first interconnection sub-region 160A, and some other of the groups of first contact structures 148A may be located within a second interconnection sub-region 160B. The interconnection region 156 may be divided along a section line 162, such that each of a first group 148A_1 and a third group 148A_3 of the first contact structures 148A are located within the first interconnection sub-region 160A, and each of a second group 148A_2 and a fourth group 148A_4 of the first contact structures 148A are located within the second interconnection sub-region 160B.

As shown in FIG. 6, within the first interconnection sub-region 160A, the first group 148A_1 of the first contact structures 148A may include four (4) of the first contact structures 148A ganged together within the second row 146B of the contact structures 146; and the third group 148A_3 of the first contact structures 148A may include another four (4) of the first contact structures 148A ganged together within the third row 146B of the contact structures 146. In addition, within the second interconnection sub-region 160B, the second group 148A_2 of the first contact structures 148A may include a further four (4) of the first contact structures 148A ganged together within the second row 146B of the contact structures 146; and the fourth group 148A_4 of the first contact structures 148A may include an additional four (4) of the first contact structures 148A ganged together within the third row 146B of the contact structures 146. The first contact structures 148A of an individual group (e.g., the first group 148A_1, the second group 148A_2, the third group 148A_3, or the fourth group 148A_4) of the first contact structures 148A may be ganged together by way of conductive routing structures 158. An individual conductive routing structures 158 may, for example, be coupled to the first contact structures 148A of an individual group by way of the contact structure top contacts 134 (FIG. 2) and the conductive plugs 132 (FIG. 2). In additional embodiments, one or more (e.g., each) of the groups (e.g., the first group 148A_1, the second group 148A_2, the third group 148A_3, or the fourth group 148A_4) of the first contact structures 148A individually includes a different quantity of first contact structures 148A ganged together, such as less than four (4) first contact structures 148A, or more than four (4) first contact structures 148A.

Figure 7:
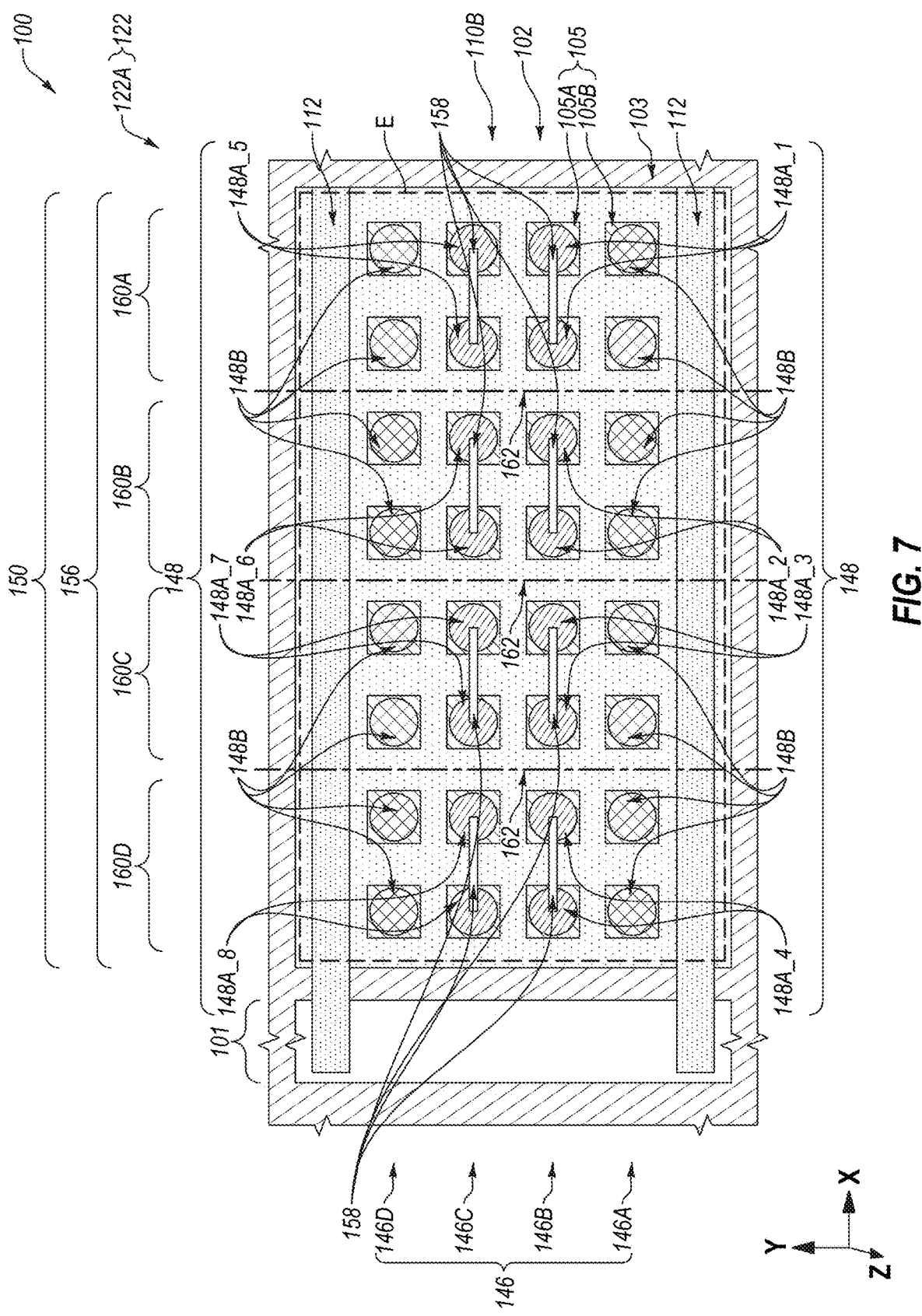

FIG. 7 is a simplified, partial top-down view that includes an alternate configuration for the section E of the portion of the microelectronic device structure 100 depicted in FIG. 1, in accordance with additional embodiments of the disclosure. FIG. 7 shows an embodiment of a different conductive routing configuration that may be employed in combination with the arrangement of the first contact structures 148A and the second contact structures 148B within the stadium-proximate section 150 of the array-proximate crest region 122A of the block 110. As depicted in FIG. 7, groups of first contact structures 148A may be ganged together within the interconnection region 156. Some of the groups of first contact structures 148A may be located within a first interconnection sub-region 160A, some other of the groups of first contact structures 148A may be located within a second interconnection sub-region 160B, yet some other of the groups of first contact structures 148A may be located within a third interconnection sub-region 160C, and yet still some other of the groups of first contact structures 148A may be located within a third interconnection sub-region 160D. The interconnection region 156 may be divided along multiple (e.g., more than one) section lines 162. Each of a first group 148A_1 and a fifth group 148A_5 of the first contact structures 148A may be located within the first interconnection sub-region 160A. Each of a second group 148A_2 and a sixth group 148A_6 of the first contact structures 148A may be located within the second interconnection sub-region 160B. Each of a third group 148A_3 and a seventh group 148A_7 of the first contact structures 148A may be located within the third interconnection sub-region 160C. Each of a fourth group 148A_4 and an eighth group 148A_8 of the first contact structures 148A may be located within the forth interconnection sub-region 160D.

As shown in FIG. 7, within the first interconnection sub-region 160A, the first group 148A_1 of the first contact structures 148A may include two (2) of the first contact structures 148A ganged together within the second row 146B of the contact structures 146; and the fifth group 148A_5 of the first contact structures 148A may include another two (2) of the first contact structures 148A ganged together within the third row 146B of the contact structures 146. Within the second interconnection sub-region 160B, the second group 148A_2 of the first contact structures 148A may include a further two (2) of the first contact structures 148A ganged together within the second row 146B of the contact structures 146; and the sixth group 148A_6 of the first contact structures 148A may include an additional two (2) of the first contact structures 148A ganged together within the third row 146B of the contact structures 146. Within the third interconnection sub-region 160C, the third group 148A_3 of the first contact structures 148A may include a yet further two (2) of the first contact structures 148A ganged together within the second row 146B of the contact structures 146; and the seventh group 148A_7 of the first contact structures 148A may include a yet additional two (2) of the first contact structures 148A ganged together within the third row 146B of the contact structures 146. Within the fourth interconnection sub-region 160D, the fourth group 148A_4 of the first contact structures 148A may include a yet still further two (2) of the first contact structures 148A ganged together within the second row 146B of the contact structures 146; and the eighth group 148A_8 of the first contact structures 148A may include a yet still additional two (2) of the first contact structures 148A ganged together within the third row 146B of the contact structures 146. The first contact structures 148A of an individual group (e.g., the first group 148A_1, the second group 148A_2, the third group 148A_3, the fourth group 148A_4, the fifth group 148A_5, the sixth group 148A_6, the seventh group 148A_7, or the eighth group 148A_8) of the first contact structures 148A may be ganged together by way of conductive routing structures 158. An individual conductive routing structures 158 may, for example, be coupled to the first contact structures 148A of an individual group by way of the contact structure top contacts 134 (FIG. 2) and the conductive plugs 132 (FIG. 2). In additional embodiments, one or more (e.g., each) of the groups (e.g., the first group 148A_1, the second group 148A_2, the third group 148A_3, the fourth group 148A_4, the fifth group 148A_5, the sixth group 148A_6, the seventh group 148A_7, or the eighth group 148A_8) of the first contact structures 148A individually includes a different quantity of first contact structures 148A ganged together, such as more than two (2) first contact structures 148A.

Microelectronic device structures (e.g., the microelectronic device structure 100 described with reference to one of more of FIGS. 1, 2-5A, 6 and 7; the microelectronic device structure 200 described with reference to FIG. 5B) of the disclosure may be included in microelectronic devices of the disclosure. For example, FIG. 8 illustrates a partial cutaway perspective view of a portion of a microelectronic device 300 (e.g., a memory device, such as a 3D NAND Flash memory device) including a microelectronic device structure of the disclosure (e.g., the microelectronic device structures 100 or 200).

The microelectronic device 300 includes the microelectronic device structure 100 and/or the microelectronic device structure 200. For example, the microelectronic device structure 100 and/or the microelectronic device structure 200 of the microelectronic device 300 includes the stack structure 102 and includes, without limitation, the blocks 110 separated by the filled slot structures 112; the source tier 103 underlying the stack structure 102; and contact structures 148 including the first contact structures 148A on connected conductive structures 105A of the source tier 103, and including the second contact structures 148B on the floating conductive structures 105B of the source tier 103. The microelectronic device 300 includes the first contact structures 148A seated upon (e.g., landing on, in physical contact with) the first conductive structures 105A, and the second contact structures 148B seated upon (e.g., landing on, in physical contact with) the second conductive structures 105B. Some of the first contact structures 148A may be positioned within the array-proximate crest regions 122, and may be arranged within the second row 146B and the third row 146C (e.g., FIGS. 3, 4, 5A, 6 and 7) of the contact structures 148. Some of the second contact structures 148B may also be in the array-proximate crest regions 122, and may be arranged within the first row 146A and the fourth row 146D (e.g., FIGS. 3, 4, 5A, 6 and 7) of the contact structures 148. Each of the first contact structures 148A and the second contact structured 148B may extend vertically through the stack structure 102.

Further, additional contact structures 164 may be positioned upon the steps 118 of one or more staircase structures 116 of one or more stadium structures 114 of the blocks 110 of the stack structure 102. The additional contact structures 164 may be coupled to the conductive material 106 of the tiers 108 of the stack structure 102. In addition, further contact structures 166 (e.g., further support contact structures) may also vertically extend through portions of the stack structure 102 within horizontal areas of the staircase structures 116.

Figure 8:
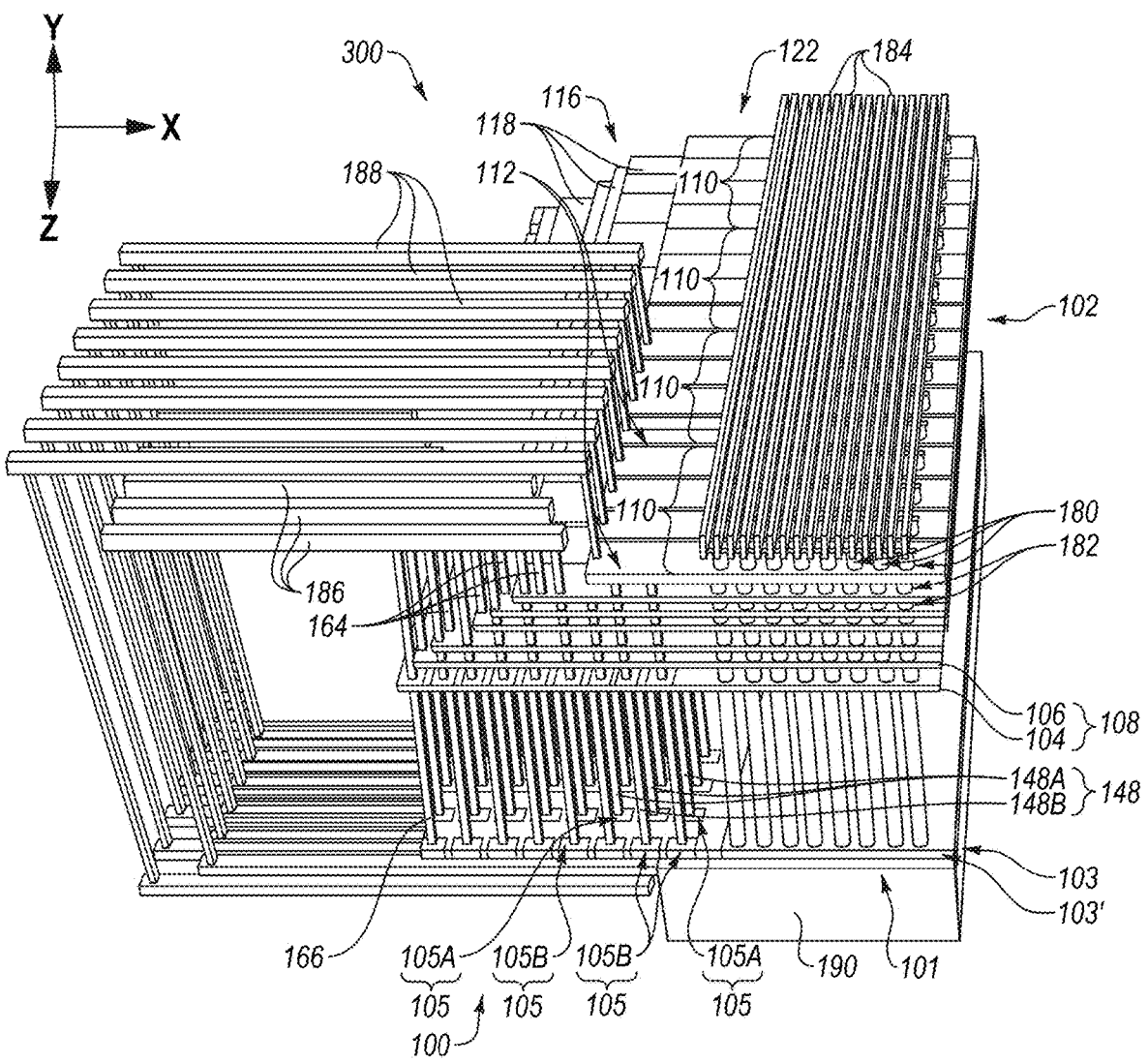
FIG. 8 illustrates a partial cutaway perspective view of a portion of a microelectronic device, according to embodiments of disclosure.

As shown in FIG. 8, the microelectronic device 300 may further include strings 180 of memory cells 182 vertically coupled to each other in series, data lines 184 (e.g., bit lines), access lines 186, and select lines 188. The strings 180 of the memory cells 182 extend vertically and orthogonally to conductive lines and tiers (e.g., the data lines 184, the source tier 103, the tiers 108 (FIGS. 1 and 2) of the stack structure 102, the access lines 186, the select lines 188) of the microelectronic device 300, and the conductive additional contact structures 164 may couple components to each other as shown (e.g., the access lines 186 and the select lines 188 to the tiers 108 of the stack structure 102 of the microelectronic device structure 100).

With continued reference to FIG. 8, the microelectronic device 300 may also include a control unit 190 (e.g., a control device) positioned vertically below the strings 180 of memory cells 182, which may include one or more of string driver circuitry, pass gates, circuitry for selecting gates, circuitry for selecting conductive lines (e.g., the data lines 184, the access lines 186, the select lines 188, additional data lines, additional access lines, additional select lines), circuitry for amplifying signals, and circuitry for sensing signals. The circuitry of the control unit 190 may, for example, be coupled to the data lines 184, a source structure 103' of the source tier 103, the access lines 186, and select lines 188. In some embodiments, the control unit 190 includes CMOS (complementary metal-oxide-semiconductor) circuitry. In such embodiments, the control unit 190 may be characterized as having a "CMOS under Array" ("CuA") configuration.

Figure 9:
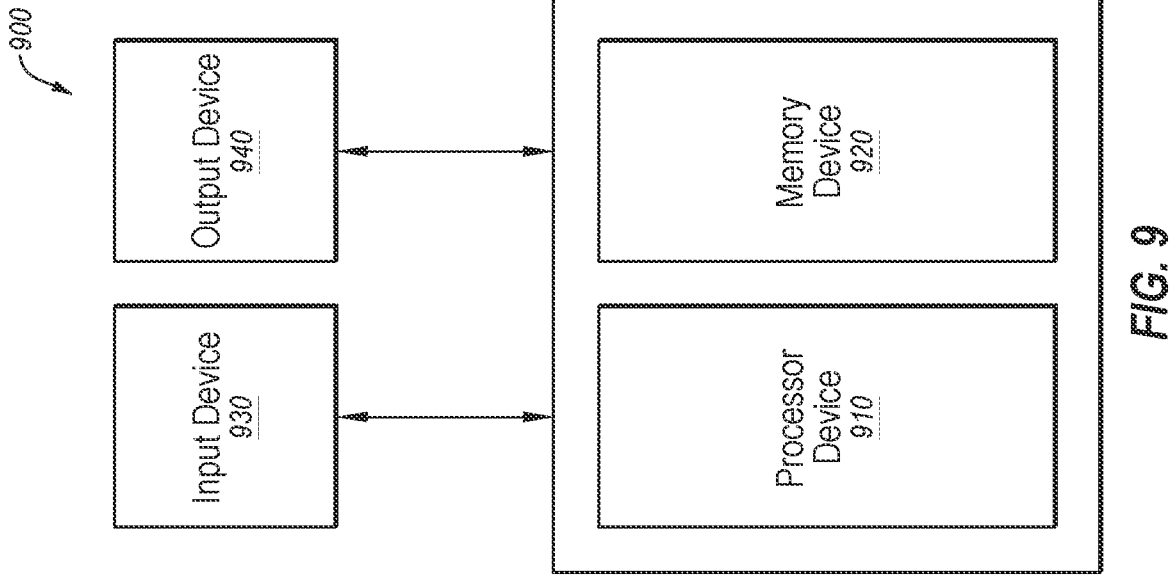
FIG. 9 is a block diagram of an electronic system, according to embodiments of disclosure.

Microelectronic devices (e.g., the microelectronic device 300 (FIG. 8)) of the disclosure may be included in embodiments of electronic systems of the disclosure. For example, FIG. 9 is a block diagram of an electronic system 900, according to embodiments of disclosure. The electronic system 900 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device. The electronic system 900 includes at least one memory device 920. The memory device 920 may include, for example, one or more of a microelectronic device (e.g., the microelectronic device 300 (FIG. 8)) and a microelectronic device structure (e.g., the microelectronic device structure 100 (FIGS. 1, 2, 3, 4, 5A, 6 and 7); the microelectronic device structure 200 (FIG. 5B)) of the disclosure. The electronic system 900 may further include at least one electronic signal processor device 910 (often referred to as a "microprocessor") that is part of an integrated circuit. The electronic signal processor device 910 may include, for example, one or more of a microelectronic device (e.g., the microelectronic device 300 (FIG. 8)) and a microelectronic device structure (e.g., the microelectronic device structure 100 (FIGS. 1, 2, 3, 4, 5A, 6 and 7); the microelectronic device structure 200 (FIG. 5B)) of the disclosure. While the memory device 920 and the electronic signal processor device 910 are depicted as two (2) separate devices in FIG. 9, in additional embodiments, a single (e.g., only one) memory/processor device having the functionalities of the memory device 920 and the electronic signal processor device 910 is included in the electronic system 900. In such embodiments, the memory/processor device may include, for example, one or more of a microelectronic device (e.g., the microelectronic device 300 (FIG. 8)) and a microelectronic device structure (e.g., the microelectronic device structures 100 (FIGS. 1, 2, 3, 4, 5A, 6 and 7); the microelectronic device structure 200 (FIG. 5B)) of the disclosure. The processor device 910 and the memory device 920 may be part of a disaggregated-die, assembly 910 and 920 that may also be referred to as a disaggregated-die integrated circuit, including at least one of the processor device 910 and the memory device 920 includes more than one of such device in a more-than-two device disaggregated-die integrated circuit assembly. Further, the disaggregated-die assembly 910 and 920, may be assembled with a bridge material such as in an embedded multi-interconnect bridge that includes at least one TSV interconnect.

The electronic system 900 may further include one or more input devices 930 for inputting information into the electronic system 900 by a user, such as, for example, a mouse or other pointing device, a keyboard, a touchpad, a button, or a control panel. The electronic system 1400 may further include one or more output devices 940 for outputting information (e.g., visual or audio output) to a user such as, for example, a monitor, a display, a printer, an audio output jack, and/or a speaker. In some embodiments, the input device 930 and the output device 940 may comprise a single touchscreen device that can be used both to input information to the electronic system 900 and to output visual information to a user. The input device 930 and the output device 940 may communicate electrically with one or more of the memory device 920 and the electronic signal processor device 910.

Thus, disclosed is a microelectronic device, comprising: a stack structure comprising a vertically alternating sequence of conductive material and insulative material arranged in tiers, the stack structure divided into blocks separated from one another by filled slot structures, each of the blocks comprising: a memory array region; staircase structures having steps comprising horizontal ends of at least some of the tiers of the stack structure; and crest regions interposed in a first horizontal direction between horizontally neighboring pairs of the staircase structures within the blocks, a first crest region of the crest regions interposed in the first horizontal direction between the memory array region and a first of the staircase structures; and contact structures within the first crest region of each of the blocks and vertically extending through the stack structure to a source tier underlying the stack structure, the contact structures comprising: first contact structures in electrical communication with control logic circuitry; and second contact structures electrically isolated from the control logic circuitry, at least some the first contact structures relatively more centrally positioned with each of the blocks in a second horizontal direction orthogonal to the first horizontal direction than at least some of the second contact structures.

In addition, disclosed is a method of forming a microelectronic device, comprising: identifying first contact structure locations in outer columns of blocks of a microelectronic device structure at staircase-proximate sections of array-proximate crest regions; relocating and forming the first contact structure locations to inner column locations; and forming second contact structures at outer column locations, wherein the first contact structures at the inner column locations are adjacent and proximate second contact structures.

Moreover, disclosed is a memory device, comprising: a stack structure comprising a vertically alternating sequence of conductive material and insulative material arranged in tiers, and the stack structure divided into blocks separated from one another by filled slot structures; a source tier underlying the stack structure; staircase structures within the blocks of the stack structure; crest regions within the blocks of the stack structure and horizontally interposed between horizontally neighboring pairs of the staircase structures, the crest regions further comprising array-proximate crest regions that are between memory array device structures and some staircase structures; memory array device structures adjacent the array-proximate crest regions; and contact structures extending through the tiers to the source tier from the array-proximate crest regions, wherein the contact structures are proximate and spaced apart from staircase structures at a level of the array-proximate crest regions, the contact structures comprising first contact structures and second contact structures arranged proximate one another, the first contact structures centered in the blocks and the second contact structures peripheral to the first contact structures in the blocks, wherein at least some of the second contact structures are spaced apart and adjacent contact structures in the staircase structures; data lines overlying the stack structure and in electrical communication with the vertically extending strings of memory cells; a source structure within the source tier and in electrical communication with the vertically extending strings of memory cells; conductive contact structures on at least some of the steps of stadium structures of the blocks; conductive lines in electrical communication to the conductive contact structures; and a control device in electrical communication with the data lines, the source structure, and the conductive lines.

Furthermore, disclosed is an electronic system, comprising: an input device; an output device; a processor device operably coupled to the input device and the output device; and a memory device operably coupled to the processor device and comprising at least one microelectronic device structure comprising: a stack structure comprising a vertically alternating sequence of conductive material and insulative material arranged in tiers, each of the tiers individually comprising some of the conductive material vertically neighboring some of the insulative material, and the stack structure divided into blocks separated from one another by filled slot structures; staircase structures within the blocks of the stack structure, each of the staircase structures having steps comprising horizontal ends of at least some of the tiers of the stack structure; bridge regions within the blocks of the stack structure and horizontally interposed between staircase structures and the dielectric-filled slot structures, the bridge regions horizontally extending from and between crest regions; crest regions within the blocks of the stack structure and horizontally interposed between horizontally neighboring pairs of the staircase structures, the crest regions further comprising array-proximate crest regions that are between memory array device structures and some staircase structures; memory array device structures adjacent the array-proximate crest regions; and contact structures extending through the tiers at the array-proximate crest regions, wherein the contact structures are proximate and spaced apart from staircase structures at a level of the array-proximate crest regions, the contact structures comprising first contact structures and second contact structures arranged proximate one another, the first contact structures centered in the blocks and the second contact structures peripheral to the first contact structures in the blocks, wherein at least some of the second contact structures are spaced apart and adjacent contact structures in the staircase structures; data lines overlying the stack structure and in electrical communication with the vertically extending strings of memory cells; a source structure within the source tier and in electrical communication with the vertically extending strings of memory cells; conductive contact structures on at least some of the steps of the stadium structures of the blocks; conductive lines in electrical communication to the conductive contact structures; and a control device in electrical communication with the data lines, the source structure, and the conductive lines.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
a stack structure comprising a vertically alternating sequence of conductive material and insulative material arranged in tiers, the stack structure divided into blocks separated from one another by filled slot structures, each of the blocks comprising:
a memory array region;
staircase structures having steps comprising horizontal ends of at least some of the tiers of the stack structure;
crest regions interposed in a first horizontal direction between horizontally neighboring pairs of the staircase structures within the blocks, a first crest region of the crest regions interposed in the first horizontal direction between the memory array region and a first of the staircase structures; and
bridge regions extending from and between the crest regions in the first horizontal direction and neighboring the staircase structures in a second horizontal direction orthogonal to the first horizontal direction; and
contact structures within the first crest region of each of the blocks and vertically extending through the stack structure to a source tier underlying the stack structure, the contact structures comprising:
first contact structures in electrical communication with control logic circuitry; and
second contact structures electrically isolated from the control logic circuitry, at least some of the first contact structures relatively more centrally positioned with each of the blocks in the second horizontal direction than at least some of the second contact structures.

2. The microelectronic device of claim 1, wherein:
the contact structures are arranged in rows extending in the first horizontal direction and columns extending in the second horizontal direction;
rows of the contact structures most horizontally proximate the filled slot structures include the second contact structures; and
additional rows of the contact structures include the first contact structures.

3. The microelectronic device of claim 2, wherein one of the columns of the contact structures most proximate the first of the staircase structures only includes the second contact structures.

4. The microelectronic device of claim 2, wherein the first crest region of each of the blocks comprises:

a section relatively more horizontally proximate the first of the staircase structures; and an additional section relatively more horizontally proximate the memory array region, at least one of the columns of the contact structures within the additional section only including the first contact structures.

5. The microelectronic device of claim 2, wherein the first crest region of each of the blocks comprises:

a section relatively more horizontally proximate the first of the staircase structures, at least one of the columns of the contact structures within the section only including the second contact structures, and at least one other of the columns of the contact structures within the section including the first contact structures and the second contact structures; and an additional section relatively more horizontally proximate the memory array region.

6. The microelectronic device of claim 5, wherein at least one further of the columns of contact structures within the additional section includes the first contact structures and the second contact structures.

7. A microelectronic device, comprising:

a stack structure comprising a vertically alternating sequence of conductive material and insulative material arranged in tiers, the stack structure divided into blocks separated from one another by filled slot structures, each of the blocks comprising:

a memory array region;

staircase structures having steps comprising horizontal ends of at least some of the tiers of the stack structure; and crest regions interposed in a first horizontal direction between horizontally neighboring pairs of the staircase structures within the blocks, a first crest region of the crest regions interposed in the first horizontal direction between the memory array region and a first of the staircase structures, the first crest region comprising:

a section relatively more horizontally proximate the first of the staircase structures; and an additional section relatively more horizontally proximate the memory array region; and contact structures within the first crest region of each of the blocks and vertically extending through the stack structure to a source tier underlying the stack structure, the contact structures arranged in rows extending in the first horizontal direction and columns extending in a second horizontal direction orthogonal to the first horizontal direction, the contact structures comprising:

first contact structures in electrical communication with control logic circuitry; and second contact structures electrically isolated from the control logic circuitry, at least some of the first contact structures relatively more centrally positioned with each of the blocks in the second horizontal direction than at least some of the second contact structures;

wherein:

rows of the contact structures most horizontally to the proximate the filled slot structures include the second contact structures; and additional rows of the contact structures include the first contact structures, portions of the additional rows of the contact structures within the additional section of the first crest region only including the first contact structures.

8. The microelectronic device of claim 7, wherein portions of the rows of the contact structures within the additional section only include the second contact structures.

9. A microelectronic device, comprising:

a stack structure comprising a vertically alternating sequence of conductive material and insulative material arranged in tiers, the stack structure divided into blocks separated from one another by filled slot structures, each of the blocks comprising:

a memory array region;

staircase structures having steps comprising horizontal ends of at least some of the tiers of the stack structure; and crest regions interposed in a first horizontal direction between horizontally neighboring pairs of the staircase structures within the blocks, a first crest region of the crest regions interposed in the first horizontal direction between the memory array region and a first of the staircase structures;

contact structures within the first crest region of each of the blocks and vertically extending through the stack structure to a source tier underlying the stack structure, the contact structures comprising:

first contact structures in electrical communication with control logic circuitry; and second contact structures electrically isolated from the control logic circuitry, at least some of the first contact structures relatively more centrally positioned with each of the blocks in a second horizontal direction orthogonal to the first horizontal direction than at least some of the second contact structures;

first conductive structures within the source tier and in physical contact with the first contact structures; and second conductive structures within the source tier and in physical contact with the second contact structures, the second conductive structures electrically isolated from the first conductive structures.

10. The microelectronic device of claim 9, wherein at least one of the second conductive structures extends in the first horizontal direction from and between multiple of the second contact structures.

11. A microelectronic device, comprising:

a stack structure comprising a vertically alternating sequence of conductive material and insulative material arranged in tiers, the stack structure divided into blocks separated from one another by filled slot structures, each of the blocks comprising:

a memory array region;

staircase structures having steps comprising horizontal ends of at least some of the tiers of the stack structure; and crest regions interposed in a first horizontal direction between horizontally neighboring pairs of the staircase structures within the blocks, a first crest region of the crest regions interposed in the first horizontal direction between the memory array region and a first of the staircase structures;

contact structures within the first crest region of each of the blocks and vertically extending through the stack structure to a source tier underlying the stack structure, the contact structures comprising:

first contact structures in electrical communication with control logic circuitry; and second contact structures electrically isolated from the control logic circuitry, at least some of the first contact structures relatively more centrally positioned with each of the blocks in a second horizontal direction orthogonal to the first horizontal direction than at least some of the second contact structures; and conductive routing structures vertically overlying and in electrical communication with the first contact structures, at least one of the conductive routing structures coupled to a different group of the first contact structures than at least one other of the conductive routing structures.

12. The microelectronic device of claim 11, wherein at least two of the conductive routing structures extending in parallel in the first horizontal direction, a first of at least two of the conductive routing structures coupled to a first group of the first contact structures within a first row of the contact structures extending in the first horizontal direction, and a second of at least two of the conductive routing structures coupled to a second group of the first contact structures within a second row of the contact structures extending in the first horizontal direction.

13. The microelectronic device of claim 12, wherein at least one other of the conductive routing structures extends in series with at least one of the at least two of the conductive routing structures in the first horizontal direction, the at least one other of the conductive routing structures coupled to at least one other group of the first contact structures.

14. The microelectronic device of claim 13, wherein the at least one other of the conductive routing structures comprises:

a first additional one of the conductive routing structures extending in series with the first of at least two of the conductive routing structures, the first additional one of the conductive routing structures coupled to a third group of the first contact structures within the first row of the contact structures; and a second additional one of the conductive routing structures extending in series with the second of at least two of the conductive routing structures, the second additional one of the conductive routing structures coupled to a fourth group of the first contact structures within the second row of the contact structures.

15. A memory device, comprising:

a stack structure comprising tiers each comprising conductive material and insulative material vertically adjacent the conductive material, the stack structure divided into blocks separated from one another by dielectric-filled slot structures, at least one of the blocks comprising:

a memory array region comprising strings of memory cells vertically extending through the stack structure;

staircase structures comprising edges of the tiers;

crest regions horizontally interposed between horizontally neighboring staircase structures, one of the crest regions horizontally interposed between the memory array region and a vertically highest one of the staircase structures; and bridge regions extending from and between the crest regions in a first horizontal direction and neighboring the staircase structures in a second horizontal direction;

data lines overlying the stack structure and in electrical communication with the strings of memory cells;

a source tier underlying the stack structure and comprising a source structure in electrical communication with the strings of memory cells;

a control device underlying the source tier and comprising control logic circuitry in electrical communication with the data lines and the source structure; and contact structures within the one of the crest regions of the at least one of the blocks and vertically extending through the stack structure and into the source tier, the contact structures comprising:

first contact structures in electrical communication with the control logic circuitry of the control device, multiple of the first contact structures ganged together by way of conductive routing structures overlying the stack structure, and multiple other of the first contact structures ganged together by way of additional conductive routing structures overlying the stack structure; and second contact structures electrically isolated from the control logic circuitry of the control device, at least some of the first contact structures relatively more horizontally distal from the dielectric-filled slot structures than at least some of the second contact structures.

16. The memory device of claim 15, wherein the contact structures are arranged in at least four rows extending in parallel between the memory array region and the vertically highest one of the staircase structures, two of the at least four rows most proximate the dielectric-filled slot structures including the second contact structures, and two other of the at least four rows interposed between the two of the at least four rows including the first contact structures.

17. An electronic system, comprising:

an input device;

an output device;

a processor device operably coupled to the input device and the output device; and a memory device operably coupled to the processor device and comprising at least one microelectronic device structure comprising:

a stack structure comprising a vertically alternating sequence of conductive material and insulative material arranged in tiers, the stack structure divided into blocks separated from one another by filled slot structures, the blocks individually comprising:

a memory array region comprising vertically extending strings of memory cells;

staircase structures having steps comprising horizontal ends of at least some of the tiers;

crest regions horizontally interposed between horizontally neighboring ones of the staircase structures, a first of the crest regions horizontally interposed between the memory array region and a first of the staircase structures and comprising:

a section relatively more horizontally proximate the first of the staircase structures; and an additional section relatively more horizontally proximate the memory array region; and bridge regions horizontally neighboring the staircase structures and horizontally extending from and between the crest regions;

digit lines coupled with the vertically extending of memory cells;

a source tier comprising a source structure coupled with the vertically extending strings of memory cells;

control logic circuitry coupled with the digit lines and the source structure; and contact structures within the first of the crest regions of the blocks of the stack structure and extending through the stack structure and into the source tier, the contact structures arranged in rows extending in a first horizontal direction and columns extending in a second horizontal direction orthogonal to the first horizontal direction, the contact structures comprising:

first contact structures in electrical communication with the control logic circuitry; and second contact structures electrically isolated from the control logic circuitry, at least some of the first contact structures relatively more horizontally offset from horizontal boundaries of the blocks than at least some of the second contact structures;

wherein:

rows of the contact structures most horizontally to the proximate the filled slot structures include the second contact structures;

additional rows of the contact structures include the first contact structures;

at least one of the columns of the contact structures within the section only includes the second contact structures;

at least one other of the columns of the contact structures within the section includes the first contact structures and the second contact structures; and at least one further of the columns of the contact structures within the additional section includes the first contact structures and the second contact structures.

18. The electronic system of claim 17, wherein the memory device comprises a 3D NAND Flash memory device.

* * * * *